United States Patent
Hollars et al.

(10) Patent No.: US 6,488,824 B1
(45) Date of Patent: Dec. 3, 2002

(54) SPUTTERING APPARATUS AND PROCESS FOR HIGH RATE COATINGS

(75) Inventors: Dennis R. Hollars, San Jose; Martin P. Rosenblum, Menlo Park; Carl T. Petersen, Fremont, all of CA (US)

(73) Assignee: Raycom Technologies, Inc., San Jose, CA (US)

( * ) Notice: Subject to any disclaimer, the term of this patent is extended or adjusted under 35 U.S.C. 154(b) by 0 days.

(21) Appl. No.: 09/616,489

(22) Filed: Jul. 14, 2000

Related U.S. Application Data

(63) Continuation-in-part of application No. 09/397,445, filed on Sep. 16, 1999, now Pat. No. 6,365,010
(60) Provisional application No. 60/107,386, filed on Nov. 6, 1998.

(51) Int. Cl.[7] .............................................. C23C 14/35
(52) U.S. Cl. .......................... 204/192.22; 204/192.12; 204/298.07; 204/298.11; 204/298.12; 204/298.2; 204/298.22; 204/298.26; 204/298.28
(58) Field of Search ..................... 204/192.12, 192.22, 204/298.07, 298.11, 298.12, 298.2, 298.22, 298.26, 298.28

(56) References Cited

U.S. PATENT DOCUMENTS

| | | | |
|---|---|---|---|
| 4,166,018 A | 8/1979 | Chapin | 204/192 R |
| 4,356,073 A | 10/1982 | McKelvey | 204/192 R |
| 4,420,385 A | 12/1983 | Hartsough | 204/192 R |
| 4,445,997 A | 5/1984 | McKelvey | 204/298 |
| 4,466,877 A | 8/1984 | McKelvey | 204/298 |
| 4,851,095 A | 7/1989 | Scobey et al. | 204/192.12 |
| 5,108,574 A | * 4/1992 | Kirs et al. | 204/298.22 |
| 5,169,509 A | 12/1992 | Latz et al. | 204/298.03 |
| 5,262,028 A | 11/1993 | Manley | 204/192.12 |
| 5,338,422 A | 8/1994 | Belkind et al. | 204/192.12 |
| 5,384,021 A | 1/1995 | Thwaites | 204/298.21 |
| 5,417,833 A | 5/1995 | Harra et al. | 204/298.2 |
| 5,645,699 A | 7/1997 | Sieck | 204/192.12 |
| 5,814,195 A | 9/1998 | Lehan et al. | 204/192.12 |

FOREIGN PATENT DOCUMENTS

WO 92/01081 1/1992 ............ C23C/14/34

OTHER PUBLICATIONS

Strong, J., *Procedures in Experimental Physics*, Prentice-Hall, Inc., NY, Copyright 1938, Thirteenth Printing 1947, 159–165.

Shatterproof Glass Corporation, "Rotatable Magnetron Sputtering Source", *Solid State Technology*, Apr. (1986) 63–64.

M. Scherer, J., et al, "Reactive Alternating Current Magnetron Sputtering of Dielectric Layers", *J. Vac. Technol. A*, vol. 10(4), Jul./Aug. (1992) 1772–1776.

* cited by examiner

*Primary Examiner*—Steven H. VerSteeg
(74) *Attorney, Agent, or Firm*—Oppenheimer, Wolff & Donnelly LLP; Claude A. S. Hamrick

(57) ABSTRACT

A sputtering apparatus and method for high rate deposition of electrically insulating and semiconducting coatings with substantially uniform stoichiometry. At least one set of vertically mounted, dual and triple rotatable cylindrical (or planar) magnetrons with associated vacuum pumps, form semi-isolated sputtering modules. The sputtering modules can be independently controlled for the sequential deposition of layers of similar or different materials. Constant voltage operation of AC power with an optional reactive gas flow feedback loop maintains constant coating stoichiometry during small changes in pumping speed caused by substrate motion. The coating method is extremely stable over long periods (days) of operation, with the film stoichiometry being selectable by the voltage control point. The apparatus may take the form of a circular arrangement of modules for batch coating of wafer-like substrates, or the modules may be arranged linearly for the coating of large planar substrates

38 Claims, 23 Drawing Sheets

SPUTTERING APPARATUS AND PROCESS FOR HIGH RATE COATINGS

REFERENCE TO PRIOR APPLICATIONS

This application is a continuation-in-part (CIP) of U.S. application Ser. No. 09/397,445, filed Sep. 16, 1999, now U.S. Pat. No. 6,365,010 which claims the benefit of U.S. Provisional Application No. 60/107,386, filed Nov. 6, 1998, and entitled "Sputtering Apparatus and Process for High Rate Coatings".

BACKGROUND OF THE INVENTION

1. Field of the Invention

This invention relates generally to physical vapor deposition (PVD) coating systems and processes, and more particularly to sputtering machines utilizing magnetrons operated in a manner which produces high deposition rates with excellent process control and long term operating stability. The design of such machines and processes is intended to make it useful for depositing metallic, electrically insulating (dielectric) and semiconducting films on a variety of substrates. Products benefiting from this technology include but are not limited to computer recording heads, flat panel displays, integrated circuits, computer memory disks, and a variety of coated glass products.

2. Brief Description of the Prior Art

The methods commonly used for depositing thin film coatings in vacuum generally can be classified as physical vapor deposition (PVD) or chemical vapor deposition (CVD) processes. PVD methods can be divided into evaporation (thermal energy source) and sputtering (plasma energy source). Both evaporation and sputtering have enjoyed successful application in various product lines. Evaporation has been used mostly for coating relatively small substrates. Some examples of high tech products include eyeglasses, filters, optical windows of many types, lenses, and laser optics. These products rely heavily on dielectric coatings for their functionality. Large evaporative coating machines are used for less sophisticated metallic coatings on rolls of substrate. Typical products include food packaging, decorative coatings, and the surface coating (corrosion treatment) of rolls of steel.

The sputtering phenomenon was recognized before evaporation, but evaporation technology was developed first because sputtering deposition rates were initially so low that it was not considered useful. A familiar example of low sputtering rate is the slow erosion of the tungsten filaments of ordinary incandescent light bulbs. They are very slowly sputtered by the argon gas used to fill the bulb to protect the hot filament from oxidation. The material removal rate is so slow that only a slight discoloration is noticed on the inside of the glass envelope after many hours of use. The early development of sputtering technology used a simple cathode and anode (diode) placed in a vacuum system with the cathode formed from the metal to be sputtered. Direct current (DC) in the range of 1,000 to 20,000 volts was the most commonly used power source. The process was able to produce an opaque metal coating on glass (a mirror) in about an hour to several hours depending upon the metal used. A description of the early sputtering process is given by J. Strong in *"Procedures in Experimental Physics"* copyrighted in 1938.

Sputtering became a more commercially viable process with the invention of the planar magnetron, U.S. Pat. No. 4,166,018 issued to Chapin and entitled "Sputtering Process and Apparatus". This patent described a sputtering apparatus in which a magnetic field is formed adjacent to a planar sputtering surface with the field comprising arching lines of magnetic flux over a closed loop erosion region on the sputtering surface. A key enabling feature of the device was that the magnetic field lines penetrated the target material. The erosion region took the form of an annular erosion zone over the target material. The annular erosion zone is referred to, among those skilled in the art, as the "racetrack" because of its elongated shape on a rectangular planar magnetron. On round planar magnetrons, the "racetrack" usually has a circular shape, but it can have other shapes as dictated by the design of the magnet array so long as the racetrack is a closed loop. The magnetrons were almost always operated with DC power, and the phrase "DC Magnetron Sputtering" became the way the process was usually referred to. The erosion process caused heating in the annular erosion zone, which had to be removed by cooling the target material either directly or indirectly with water.

Industrial use of DC magnetron sputtering for the deposition of metallic films increased during the late 1970's and early 1980's. Large sputtering machines were built to coat solar heat reducing reflective films on windows for large commercial buildings and for other applications. For large substrates, it was superior to evaporation for controllability and uniformity. And, although the deposition rates were not as high as for evaporation, sputtering had become an economically useful process. Initially, in the erosion zone, early magnet arrays created a relatively sharp cross-section in the target material. A large metal target plate would quickly "burn through," resulting in very poor utilization of the material. Increased target life was achieved (i) by improving the design of the magnet array to widen the erosion zone on the surface of the target, (ii) by increasing the magnetic field strength to operate with thicker targets, and (iii) by mechanisms which moved the arrays to widen the erosion zone during operation. U.S. Pat. No. 5,262,028 issued to Manley and entitled "Planar Magnetron Sputtering Magnet Assembly" is an example of an improved design for the magnet array to widen the erosion zone. U.S. Pat. No. 5,417,833 issued to Harra et al and entitled "Sputtering Apparatus Having a Rotating Magnet Array and Fixed Electromagnets" is an example a circular planar magnetron with a rotating magnet array to improve target utilization.

Another approach to improving the utilization of the target material was taught in U.S. Pat. No. 4,356,073 issued to McKelvey. The target material was formed into a straight (constant diameter) tube, which was rotated around its cylindrical axis with internal racetrack magnets that were held fixed with respect to the substrate. In this embodiment the target material (the tube) becomes thinner as the process proceeded and no "burn through" in the erosion zone occurs. Its initial use was for the large scale coating of metal films on architectural glass by DC magnetron sputtering. The magnetron coated only one side of the glass substrate in the horizontal position. Later U.S. Pat. No. 4,445,997 again issued to McKelvey disclosed another rotatable sputtering magnetron in which the target tube was contoured longitudinally to match the geometry of a substrate with the shape of an automobile windshield. This magnetron was also designed for use in the horizontal position. In U.S. Pat. No. 4,466,877 McKelvey describes a pair of rotatable cylindrical magnetrons mounted horizontally and spaced in a parallel relationship to each other such that the sputtered flux directed inwardly and downwardly from each is focused on the same region of the substrate. Further details of this dual embodiment are given in an article by Shatterproof Glass Corporation entitled "Rotatable Magnetron Sputtering Source", *Solid State Technology*, April 1986. Two important points from the article are first, the magnetrons are rotated at speeds from 1 to 12 RPM, and second, the horizontal mounting for sputtering downward on glass causes the target cooling water to be fed through two rotating seals in vacuum, causing reliability problems and limiting rotation speeds.

In addition to the sputtering of metal films, DC reactive magnetron sputtering has been developed for the deposition of insulating (dielectric) and semiconducting coatings; in particular, for the deposition of the oxides and nitrides of metals. In reactive sputtering, the inert working gas is usually argon and the added reactive gas is often oxygen and/or nitrogen. The coating of dielectric materials can be accomplished by RF sputtering of the dielectric material itself used as the target. However, in both RF diode and RF magnetron modes the deposition rates are very low. Despite the low rates, this form of sputtering is still used in the production of thin film recording heads and integrated circuits. DC reactive magnetron sputtering of insulating films has the potential advantages of higher deposition rates and lower costs, but good process control and long term stability have been difficult problems to solve for the deposition of the highly insulating metal oxides and nitrides.

There are three characteristics of reactive DC magnetron sputtering that cause issues with control and process stability. One characteristic is generally referred to as "target poisoning" by the reactive gas. Poisoning is the term used to describe the phenomenon where, for example, oxygen reacts with the metal target surface to form an oxide. Sputtering rates for oxides are usually an order of magnitude or more less than that for the pure metal. The natural tendency for the magnetron is to be most stable in the "metal mode" or the "oxide mode" (poisoned), while the desired operating point is often between the two where the process is highly unstable. One reason for the instability is that the partial pressure of the reactive gas (e.g. oxygen) that is required at the substrate to form the insulating film is also adequate to substantially poison the target. Conventionally, some means of partial pressure separation of the reactive gas between the magnetron and the substrate has been attempted to achieve process stability. Examples include U.S. Pat. No. 4,851,095 issued to Scobey et al; U.S. Pat. No. 4,420,385 issued to Hartsough; Scherer et al, "Reactive High Rate DC Sputtering of Oxides", Thin Solid Films, Vol. 119 (1984) 203–209; Schiller et al, "Reactive DC Sputtering with the Magnetron-Platatron for Titanium Pentoxide and Titanium Oxide Films", *Thin Solid Films,* Vol. 63 (1979) 369–373; and Schiller et al, "Advances in High Rate Sputtering with Magnetron-Plasmatron Processing and Instrumentation", *Thin Solid Films*, Vol. 64 (1979) 455–467. These techniques cover the range from placing baffles partially between the magnetron and substrate and injecting the reactive gas only near the substrate, to completely separating the deposition region from the reaction region by moving the substrate. The method of Hartsough was improved and expanded by Scobey. A metallic film was deposited on substrates in one area of the machine and the substrates were then moved to another area of the machine for reaction (e.g. oxidation) to form a transparent optical film. Although they obtained relatively high net deposition rates, they were still limited by the reaction rate of the metallic film with oxygen that could be achieved in the separated reaction zone. Additionally, this separation of zones clearly limits the number of magnetrons and reaction zones which can be placed in a given vacuum chamber to half of the number of magnetrons which could otherwise be used, thus further limiting the net deposition rate of the system. In many of the examples the films required a post operation bake at elevated temperatures to fully complete the reaction.

An elaborate gas separation scheme is described in U.S. Pat. No. 5,338,422 issued to Belkind et al. It teaches a triple magnetron array consisting of a rectangular planar and two rotatable cylindrical magnetrons with unbalanced magnet arrays. The planar magnetron is partially shielded by a baffle from the rotatables, and argon (inert working gas) is injected near the planar which is operated in metal mode, while oxygen is injected near the rotatables. Another example of a gas separation apparatus U.S. Pat. No. 5,384,021 issued to Thwaites describes a machine in which a single rotatable cylindrical magnetron is augmented with supplementary magnets and reactive and ionizable gas is introduced remotely form the sputtering zone.

A second control and process stability problem involves changes in the electrical circuit of the magnetron. With a few exceptions most metal oxides and nitrides are good electrical insulators. During operation, insulating material builds up on the shields, walls, and other structures in the vacuum system, causing the electrical resistance through the plasma to the anode and any other return path back to the power supply to become higher and higher. This shift in the electrical resistance in the power circuit causes a process drift, which is difficult to control while keeping the film properties constant with time. U.S. Pat. No. 5,169,509 ('509) issued to Latz et al describes a dual rectangular planar magnetron apparatus operated by ungrounded AC power in the frequency range of 1 kilohertz to 100 kilohertz. No reference was made in '509 of the ability of AC operation to help minimize the problem with changes in circuit resistance, but it is obvious in retrospect that they were on the right track. In fact, a paper by Scherer et al (including Latz) entitled "Reactive Alternating Current Magnetron Sputtering of Dielectric Layers" that was publish soon after '509 was filed, clearly pointed out the well defined anode characteristics of the AC operation. U.S. Pat. No. 5,558,751 to Mahler et al ('751) also describes, without stating the benefits of, AC operation using high frequency power fed to a sputtering cathode. More recently, U.S. Pat. No. 5,814,195 ('195) issued to Lehan et al discusses the advantage of using AC power on dual rotatable magnetrons for anode stabilization in a very similar manner to that described by Scherer et al.

A third characteristic of reactive DC sputtering, which causes process difficulties, is the arcing phenomenon. While insulating material is building up on various structures in the vacuum system, it is also building up on non-sputtered regions of the sputtering target. This is more severe for pairs of magnetrons that are operated facing each other in order to coat both sides of a substrate simultaneously. During operation the insulating regions are constantly being bombarded by ionized inert sputtering gas (e.g. argon) which removes electrons and leaves a net positive charge on the insulating surface. Eventually, the voltage difference between the negatively charged target plate and the positively charged insulating surface reaches breakdown potential for the insulator and arcing occurs. This arcing has at least two negative consequences. First, it can disrupt the process control system, and second, it can damage the coating in a number of ways. Physical damage can occur by the arc striking the coating, the ratio of metal atoms to reactive gas atoms (stoichiometry) in the coating can be changed in the vicinity of the arc, and the arc can create particulate debris, which can get into the coating. Rotatable cylindrical magnetrons help to minimize the arcing problem because the build up of the dielectric on the active part of the target is largely prevented by the rotation (if it is rapid enough). However, there is buildup of dielectric along the outer edges of the sputtering region where arcing can still occur. Since the rotatable magnetrons are primarily used in horizontal sputter down orientation, particulate debris can be a major problem for many coating applications. AC operation of the magnetrons, as described in '509 and '195, helps to reduce arcing because the positive charge buildup on the insulating surface tends to be neutralized on each half cycle. The paper by Scherer et al explains the details of the arcing phenomenon in sputtering, and the improvement that AC operation provides. But, the arcing is not totally eliminated largely because the buildup of insulating material on the non-sputtered regions of the planar target surface becomes excessive after long periods of operation. The improvement of '195 simply substitutes rotatable magnetrons for the planar magnetrons of '509 in order to reduce the buildup of insulating material on the target surface because of the continuous rotation of the target surface past the sputtering zone. While the buildup of insulating material on rotatables is most severe at the ends of the sputtering zone, it is still significant on the sputtered surface. Indeed, the method of '195 relies upon connecting the power supply to the magnetron through a transformer and an impedance-limiting capacitor to reduce arcing. The current art still fails to provide a completely satisfactory solution to arcing for long term operation.

The deposition of the protective overcoat for computer memory disks is a good example of how the arcing problem affects a product. Carbon is sputtered in argon plus hydrogen or a hydrogen containing gas to form a hard, insulating "diamond like carbon" (DLC) protective overcoat layer. Both sides of the disk are coated simultaneously by pairs of facing magnetrons, so the buildup of insulating material on the non-sputtering regions of the target surfaces is relatively rapid. Particulate debris caused by arcing is a major source of reduced yields industry wide. AC operation offers some improvement but has done little to eliminate the problem.

Another problem with the current art is that the geometrical arrangement of the magnetrons with respect to the substrate in coating machines can cause variable stoichiometry in the deposited insulating film. Most often the substrate is caused to pass by and below the magnetron, in a direction perpendicular to its length, by some mechanical transport means. Since the partial pressure of the reactive gas near the substrate is constant, the instantaneous deposition rate over the deposition region also needs to be constant if the resulting film is to have uniform stoichiometry. This is not normally the case, and to correct it in the current art requires shielding the deposition region to a narrow slit across which the deposition rate is approximately constant. This lowers the efficiency of the use of available deposition flux by more than fifty percent. Shielding in conventional devices with a planar or cylindrical magnetron source positioned some distance from a substrate poses a flux collection efficiency problem. A large fraction of the sputtered flux does not reach the substrate, but is collected on shields that need to be changed periodically when they begin to flake due to coating stress. Even magnetrons that have good target utilization, have rather poor net coating efficiency. Variability of coating stoichiometry has not been a problem for optical films (so long as they are clear), but it can be a significant issue for products that require subsequent processing, or have requirements related to levels of stress. Post deposition chemical etching of the coating is an example in which variable film stoichiometry would not be acceptable. Also, semiconducting films which must be optically transparent and maintain a modest but uniform electrical conductivity, need to have uniform stoichiometry.

Process control for reactively depositing insulating films at high rate traditionally has been very difficult. Baffles, which provided some separation of the partial pressure of the reactive gas between the target and the substrate, allowed operation for a short time at the edge of the "poisoned" mode, with only slightly improved deposition rates when compared to no baffling. However, invariably the process drifts due to vacuum system cleanup, contamination drag in from the substrates, target erosion, substrate motion, and other factors. An improvement in process control for depositing insulating films was described in '509, which used a feedback circuit to vary the flow of reactive gas to hold the plasma potential at a constant desired value. This gave improved control and increased deposition rates, but the feedback loop is unstable against arcs, and for some films, aluminum oxide for example, there are two values of voltage corresponding to two different film compositions for the same reactive gas flow. The system is unstable for these types of films, and can transition quickly from one voltage to the other.

A prior art sputtering apparatus for the deposition of dielectric materials using an AC power supply is described by Lehan et al in the previously cited U.S. Pat. No. 5,814, 195. FIG. 1a is the schematic diagram of the AC powered sputtering system 1 of Lehan et al. A chamber 2 is fitted with a pair of horizontally mounted rotatable cylindrical magnetrons 3a supporting tubular targets 3b positioned over substrate 4. The two poles of an AC power source 5 are connected to a transformer 6, whose output is connected to magnetrons 3 through fixed and variable impedance-limiting capacitors 7. Magnet assemblies 8 create sputtering erosion zones on the surfaces of the tubular targets. This apparatus is practically identical to that taught by Latz in '509 with the planar magnetrons of '509 simply being replaced by rotatable cylindrical magnetrons. Lehan et al in '195 claim that the rotation of the target past the erosion zone cleans the dielectric buildup material off the target in portions away from the erosion zone to help reduce arcing. While this is an obvious aid in reducing arcing, a better solution which eliminates arcing would not require the transformer 6 and capacitors 7.

FIG. 1b is the enlarged schematic diagram of magnet assemblies 8 inside tubular targets 3b of FIG. 1a. Magnets 9a, 9b, and 9c in one tubular target and magnets 10a, 10b, and 10c in the other tubular target produce parallel containment areas (for electrons) 11a and 11b that form erosion zones defined by magnetic fields 12a and 12b. Nothing is specified about the polarity of the magnets, except by implication from the schematic shape of the magnetic fields, magnet 9b is opposite to 9a and 9c and 10b is opposite to 10a and 10c. In the figure all of the magnets point radially away from the geometrical centers of tubular targets 3b. Distance 13 between the magnetrons is stated to be about 1–3 inches, while distances 14 and 15 from the (grounded) chamber walls should be about four or more inches. This geometrical arrangement causes the sputtered flux to be non-uniform across the deposition region at the substrate.

Prior art sputtering equipment and processes fail to provide an economical and workable solution for obtaining controllable high rate deposition of insulating and semiconducting films in a demanding (especially high tech) manufacturing environment. Each of the methods previously described suffers from one or more of the problems commonly associated with reactive sputtering. What is needed is an improved sputtering apparatus and control process for high rate deposition of insulating and semiconducting films that require simpler geometrical baffling for reactive gas partial pressure separation, physical separation of coating and reaction zones, arc suppression circuit additions, or post deposition heat treating. In applications for high technology products, the particulate debris from all sources including arcing and coating material flaking from baffles and shields must be reduced to an absolute minimum; and, the film stoichiometry must be kept uniform throughout the thickness of the film. Additionally, the process must minimize heating of the substrate during deposition.

All of the patents and references cited above are hereby incorporated by reference for purposes of additional disclosure.

SUMMARY OF THE INVENTION

The foregoing and related problems are addressed by the present invention. Accordingly, it is an object of the present invention to provide an apparatus and process for coating substrates with dielectric or semiconducting films at high deposition rates.

A second object of the present invention is to provide a deposition process that is stable and can be accurately controlled over extended periods of operation of the apparatus.

Another object of the present invention is to provide an apparatus and process that produces dielectric and semiconducting films with controlled and uniform stoichiometry.

Another object of the present invention is to provide an apparatus and process that produces a restricted band of sputtered target material and at the same time improves the collection efficiency of the target material as well as minimizes high incidence angles effects on the properties of deposited coating.

Yet another object of the present invention is to provide an apparatus and process that provides reliable sputtering operations for producing better quality thin films at very low sputtering pressure (less than 1 milli-torr) and high deposition rates (high power).

Yet another object of the present invention is to provide an apparatus and process for depositing insulating films with greatly reduced levels of particulate debris from arcing and flaking.

Still another object of the invention is to achieve high rate reactive deposition of dielectric thin films at low sputtering pressure in the vacuum chamber while protecting the target from the reactive gas. That is, the object is to achieve practical separation between the sputtering and reactive gases in the vicinity of the target, particularly in low pressure operations.

In accordance with one aspect of the present invention the deposition apparatus comprises at least one set of improved dual or triple (or more than three) rotatable cylindrical magnetrons mounted vertically in a vacuum chamber. An apparatus with the triple cylindrical magnetrons produces a restricted band of sputtered target material while, at the same time, providing an improved collection efficiency of the target material. Associated with the set of magnetrons are baffles, shielding, a vacuum pump (or pumps), and appropriate valving which together constitute a semi-isolated sputtering enclosure or module. The preferred vertical mounting of the magnetrons (in the direction of the gravitational force) allows the target tubes to be relatively long compared to their diameter, so that they can be mounted in close proximity to each other without intermittent contact and cracking caused by mechanical deformation. The magnet assemblies are intentionally, (i.e. contrary to the conventional art) designed to provide very narrow erosion zones along the parallel sides of the racetrack (the parallel sides of each racetrack approaching a pair of line sources) for each magnetron. These parallel erosion zones have a highly concentrated plasma density for rapid sputtering of the target and any reactive material. Also, they enable sputtering at low pressures, which yields films formed at higher average energy per deposited atom. The very narrow, high plasma erosion zones allow a lower threshold rotational speed for acceptable magnetron operation because they are effective in keeping the magnetron operating in metal mode even in the presence of a relatively high partial pressure of reactive gas. The distance between the narrow, high plasma density parallel erosion zones, the placement of the vertically mounted substrate with respect to the magnetrons, and the pointing angles of the racetracks toward the substrate and each other, are optimized to form a relatively wide and efficient (above 75%) constant flux deposition region at the substrate. This allows high deposition rates at constant reactive gas partial pressures with substantially uniform film stoichiometry. The rotatable cylindrical design, if properly implemented, can have high flow rates of cooling water to allow sputtering at higher energy densities and higher deposition rates than is possible on typical planar magnetrons. Vertical mounting of the magnetrons minimizes substrate particulate contamination due to flaking from shields and adjacent structures. A very significant improvement in design is the elimination of all rotating water seals in vacuum, which provides reliable operation at rotation rates higher than 1 to 12 RPM.

The deposition apparatus that includes at least one set of improved triple rotatable cylindrical magnetrons, produces a restricted band of sputtered target material and at the same time improves, among others, the collection efficiency of the target material. Two of the three magnetrons essentially face each other forming a "hall of mirrors" to sputter and resputter the target material. The third magnetron catches and resputters the target material toward the substrate and/or the hall of mirrors magnetrons for resputtering. It is possible to place planar magnetrons in similar positions, but such configurations produces relatively lower collection efficiencies.

In another aspect of the invention, the shield around the target may continue to act as an anode if required by a particular process, but it has an additional function that is important especially for reactive sputtering. In its new role the shield acts as an element which allows a thin "sputtering gas curtain", e.g., argon curtain, to exist in a narrow annular gap (that exists between the target and shield) around those regions of the target which are not being sputtered during its rotation. The sputtering gas (e.g., argon) flows around the target and enters the sputtering area at the edges of the shield cutout. The reactive gas (oxygen for example) may be introduced near the substrate 4 (FIG. 1a). Additionally, a deposition shield prevents high angle, low energy sputtered material from reaching the substrate position. The importance of this aspect of the invention lies in the fact that the sputtering gas total pressure in the vacuum chamber can be relatively low while the sputtering gas pressure in the gap can be higher (e.g., a few millitorr). The higher pressure plus the sweeping action of the sputtering gas in the gap due to its flow keeps the region of the gap free of reactive gas. Thus the surface of the target is maintained in a state substantially free of reactive gas products during the reactive sputtering operation. This allows the apparatus to produce superior quality dielectric films while maintaining a very constant process over the lifetime of the target tube. Added control sensitivity can be achieved by admitting the reactive gas into the system by way of a fast acting valve.

According to another aspect of the present invention, the rotatable magnetrons may be powered by various combinations of DC, AC and/or RF power supplies. Several beneficial properties are obtained from the operation of the dual rotatable magnetrons with AC power in the frequency range of approximately ten to hundreds of kilohertz. In this mode the poles of the AC power supply are connected directly across the electrodes of the dual rotatable magnetrons which are electrically floating (not grounded). The combination of the AC operation with the high plasma density erosion zones previously described insure that when one magnetron is sputtering on the negative cycle of the AC power, the other magnetron provides a low and constant electrical resistance return path to the power supply. Both the high power density of the plasma and the proximity of the racetrack erosion zones, due to the racetracks being angled toward each other, provide greatly improved coupling between the magnetrons in comparison to '751 and '195. As a result of this arrangement no other part of the vacuum system mechanical structure is required to be electrically conductive, and therefore such structures could be made entirely from insulating materials if desired. It may be desirable for the structures near the magnetrons to have electrically insulating surfaces (i.e. a coating) to insure that the process remains electrically constant from startup. The frequency of the AC power may be selected (over a wide range) to minimize material specific arcing, and to provide more efficient formation of monatomic species from diatomic reactive gas molecules by taking advantage of frequency resonances in their dissociation characteristics.

By comparison, several beneficial properties are obtained from the operation of the triple rotatable magnetrons with DC power, singly or in combination with AC power, or with RF power. For sputtering of electrically conductive target materials, it is convenient to use three individual DC power sources that can be individually adjusted to meet the requirements of different process objectives. Reactive sputtering can be conveniently accomplished by driving the hall of mirrors magnetrons with AC power and the third magnetron opposite the substrate with DC power. For sputtering of non-conductive (dielectric) materials, some or all of the magnetrons are conveniently driven with RF power.

According to still another aspect of the present invention, process control is greatly improved by operating the dual rotatable magnetrons with an AC power circuit that is set at a constant pre-selected voltage while the pumping speed of the system, the flow of sputtering gas, and the flow of reactive gas are also held constant. It is found that these parameters fix the stoichiometry of the depositing film, and the process will remain stable over long periods of operation. The process has minimal sensitivity to the way the reactive gas is added to the system in the sense that elaborate schemes of baffles to provide physical separation of the partial pressure of the reactive gas between target and substrate are not needed. If several sets of dual magnetrons are to be operated in the same vacuum chamber, it is advantageous to array them in semi-isolated enclosures with dedicated pumps and baffles between the different sets of magnetrons (i.e. to form modules as previously described) to reduce any cross talk between control loops.

An advantage of the present invention is that the new apparatus and process can produce electrically insulating and semiconducting coatings at very high deposition rates for extended periods of time.

Another advantage of the present invention is that the electrically insulating and semiconducting coatings have a high degree of stoichiometric uniformity as compared to the coatings produced using the prior art.

Yet another advantage of the present invention is that it provides dielectric coatings, produced by high energy, low-pressure deposition process, which have superior density, hardness, and adhesion.

A further advantage of the present invention is that the use of baffles to maintain partial pressure separation of the reactive gas between the target and the substrate, and the injection of the reactive gas only near the substrate can be eliminated. The shields being eliminated are replaced with sputtering surfaces that recycle the target material.

Still another advantage of the present invention is that it can process multiple wafer substrates simultaneously at high throughput, thus reducing manufacturing and clean room floor-space requirements by approximately an order of magnitude for the same total output.

BRIEF DESCRIPTION OF THE DRAWINGS

These and other features, aspects and advantages of the present invention will become better understood with regard to the following description, appended claims, and accompanying drawings where:

FIG. 1b shows a cross-sectional view of the cylindrical magnetrons used with the prior art sputtering system shown in FIG. 1a;

FIG. 10b shows a side planar view of the embodiment shown in FIG. 10a;

DETAILED DESCRIPTION

The present invention is directed to coating systems and processes that utilize improved magnetrons as hereafter described. The improved magnetrons used in this invention are typically but not always necessarily similar to each other. In a dual magnetron configuration, and, likewise, in a triple magnetron configuration, two magnetrons, are mounted together substantially in parallel. Minor differences in dimensions or design details would not negate their ability to properly function together. The following describes in detail the dual and triple magnetrons configurations.

For purposes of additional disclosure, Disclosure Documents No. 443110, dated Jul. 27, 1998, No. 444066, dated Sep. 14, 1998, No. 470278, dated Mar. 3, 2000, and No. 467585, dated Jan. 12, 2000, are hereby incorporated by reference.

The Apparatus with Dual Rotatable Cylindrical Magnetrons

Figure 2A:
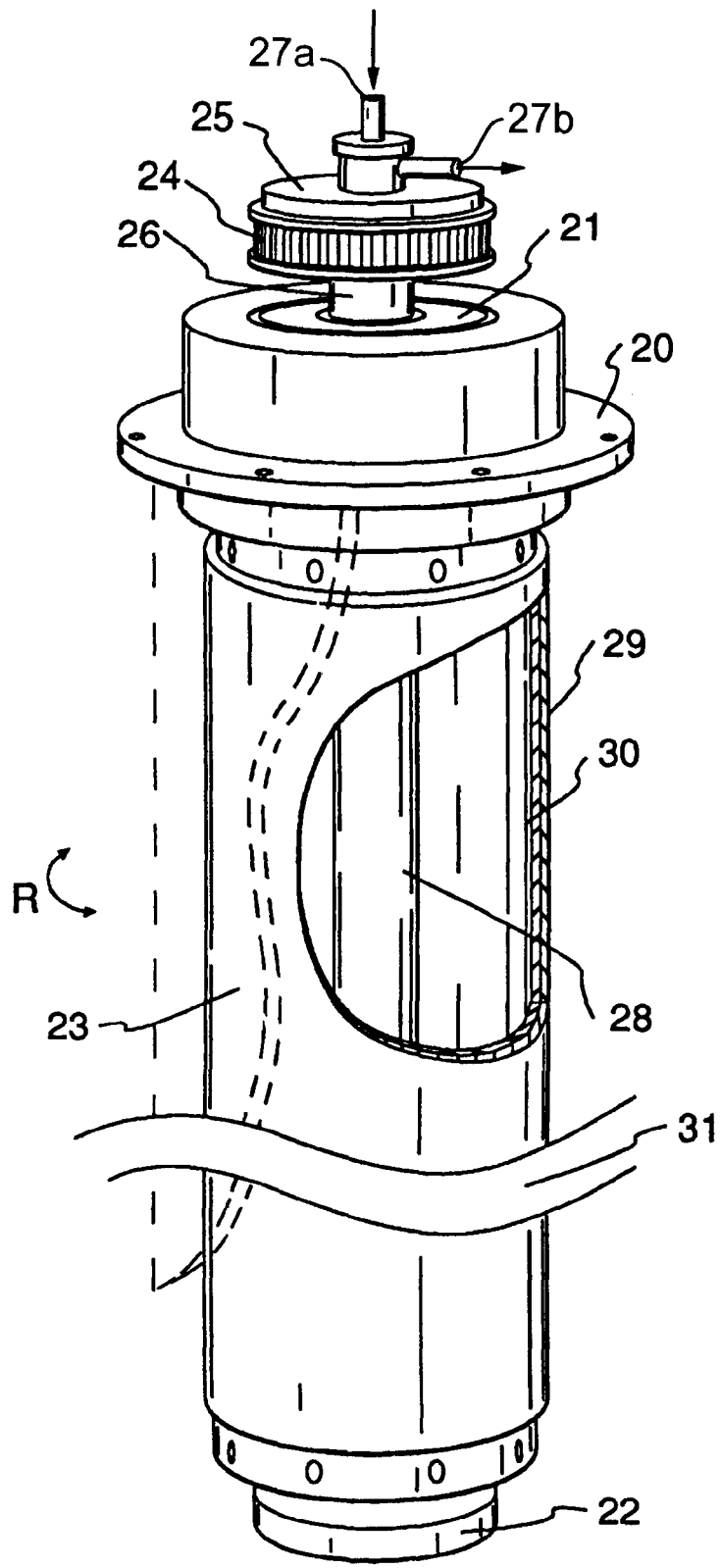
FIG. 2a shows a three dimensional perspective view illustrating one of the rotatable cylindrical magnetrons of a dual set or sets used in the various embodiments of the apparatus.

FIG. 2a is a cutaway isometric view of a typical single cylindrical rotatable magnetron, which would be paired with a second one to form the dual version. The major parts of the device include electrically insulating mounting flange and collar 20, rotary vacuum feedthrough 21, insulating alignment flange 22, sputtering (or target) material 29, rotation receiving means 24 such as a pulley or gear, electrical commutator 25, target support tube 26, and cooling fluid (normally water) input 27a and output 27b. Secondary non-rotating tube 28 is concentric with tube 26 and supports the magnet assemblies (not shown) and provides a conduit for the cooling fluid. Mounting flange and collar 20 may be widened to incorporate the second magnetron of the dual set in the same structure. Depending upon its properties, tubular target material 23 may be machined from a relatively thick wall tube, or it may consist of tubular target material 29 bonded to a backing or carrier tube 30. For example, an aluminum or copper target may be machined from a single tube, whereas a carbon target must be bonded to a backing tube of a stronger material, for instance molybdenum or stainless steel. Both tubular target material 29 and backing tube 30 rotate (either direction as indicated by the heavy double headed arrow labeled R) while sputtering takes place. The magnetron may be as short as a foot to as long as several feet with the same basic cross-section as indicated by break 31 in the figure. Limits on length result from the strength of the materials used in construction, the diameter and thickness of the target tube, and the mounting orientation of the device. Vertical mounting is preferred both to minimize the gravitationally induced bending load on the target tube, which becomes heavy when filled with coolant, and to minimize debris contamination in the resulting coating.

Figure 1A:
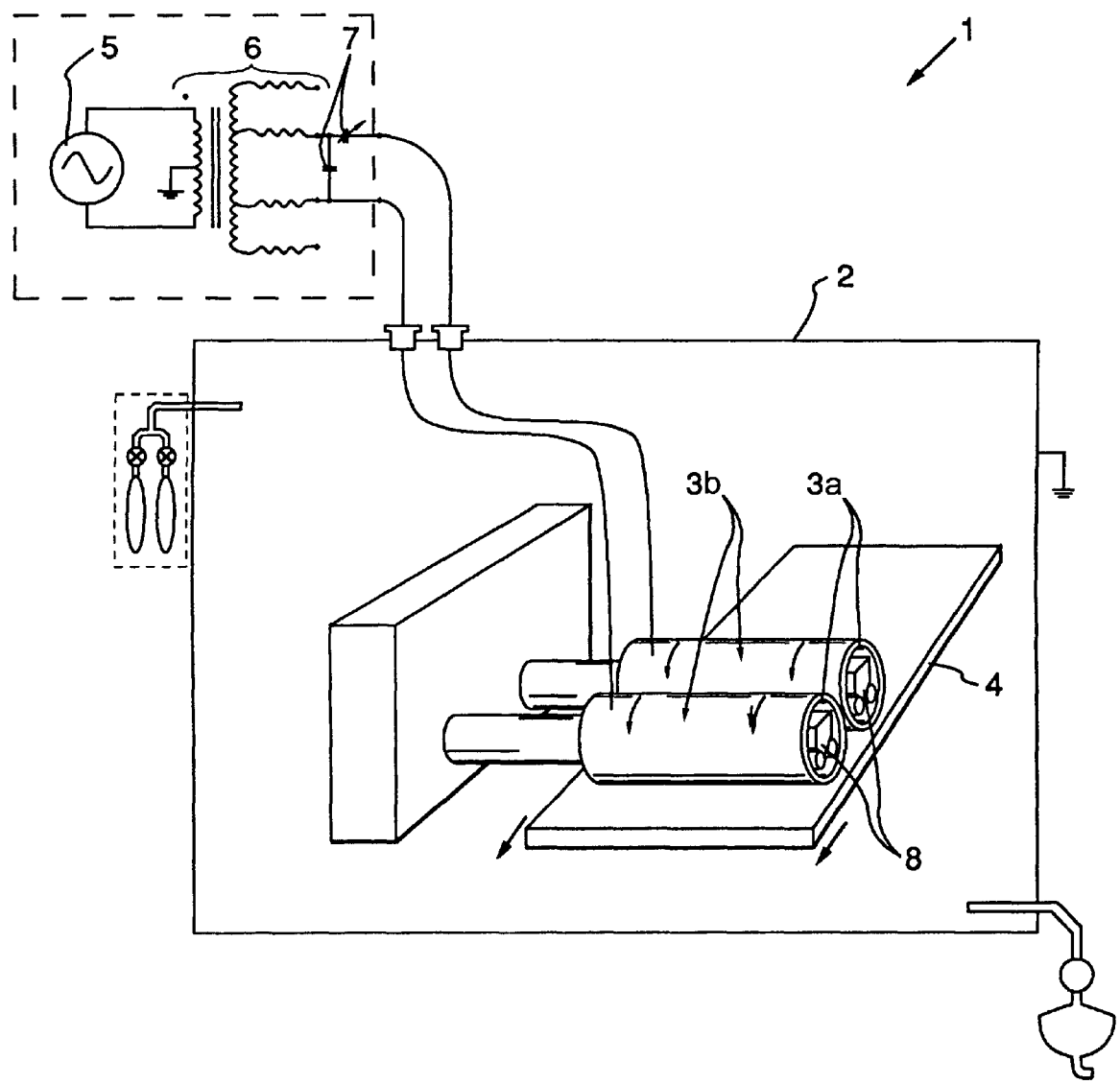
FIG. 1a shows a schematic diagram of a recent prior art sputtering system using an AC power supply with its additional arc suppressing electrical component.
Figure 1B:
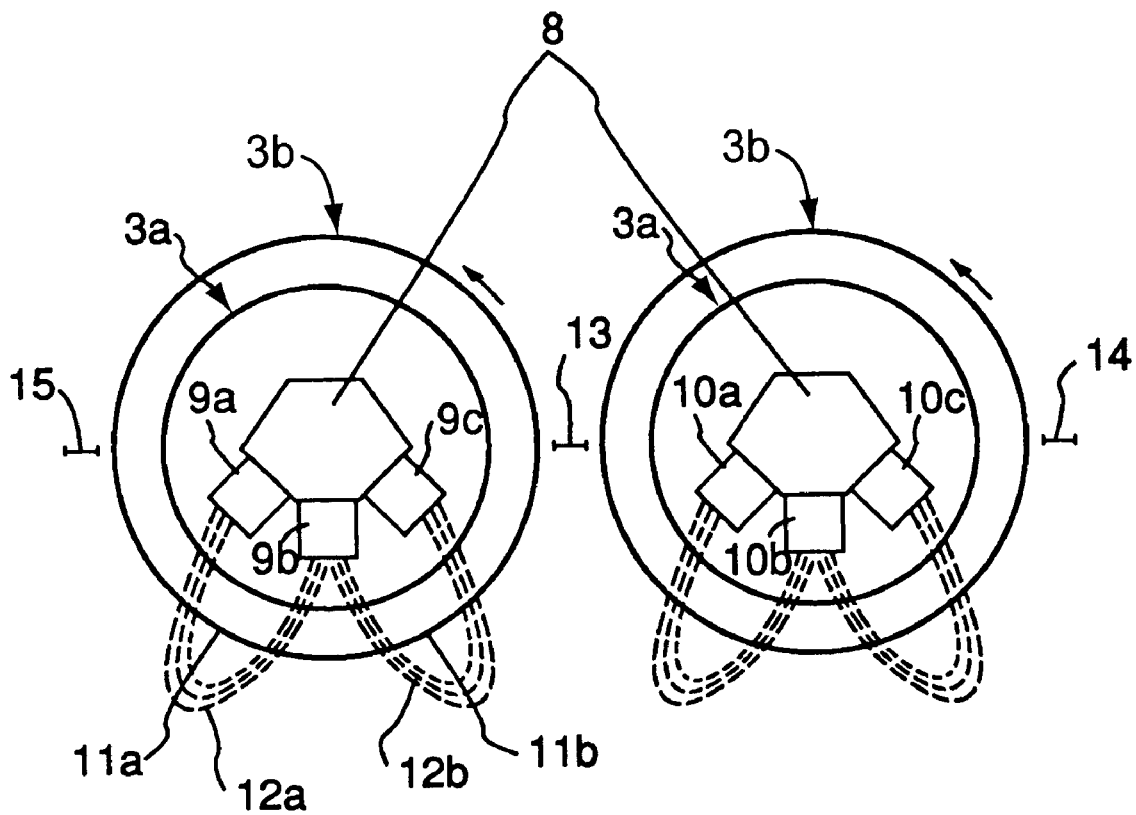
Figure 2B:
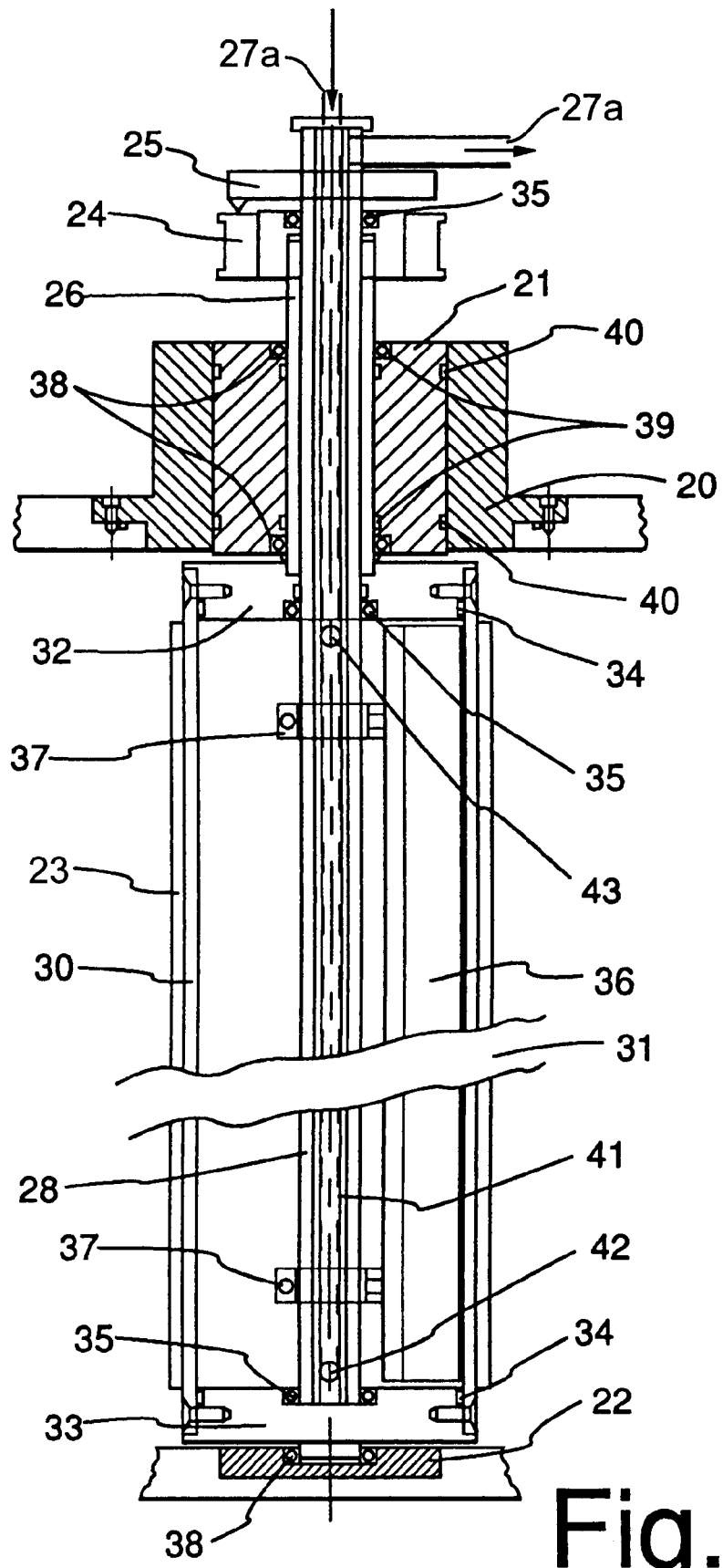
FIG. 2b shows a vertical cross sectional view illustrating the design and construction details of the rotatable cylindrical magnetron used in the apparatus.

Further details of the magnetron design are shown schematically in FIG. 2b, which is a cross-sectional view of FIG. 2a. Elements that are common to those shown in FIG. 2a are designated by the same numerals. Upper and lower tubular target supports 32 and 33 respectively are vacuum and water sealed by static O-rings 34. Target support tube 26 is permanently attached and sealed to tubular target support 32 (for example by welding) or alternatively, the part may be machined from a single piece of material. Three bearings 35 allow secondary tube 28 with electrical commutator 25, and magnet assembly or cage 36 along with support clamps 37 to remain fixed, while pulley 24, tube 26, target material 23 (FIG. 1a), and supports 32 and 33 rotate on bearings 38.

While magnet assembly 36 normally would be held fixed with respect to a substrate position, this design will also permit an independent rotation or oscillation mode of the magnet assembly. This allows the sputtering erosion zones to be scanned across a stationary substrate in contrast to having the substrate pass by stationary sputtering erosion zones. The coating of magnetic memory disks is an example where this mode of operation may be useful.

In one embodiment, O-ring seals 39 may be used to provide dynamic vacuum sealing against rotating target support tube 26. In the preferred embodiment, feedthrough 21 including seals 39 would be replaced with the more reliable ferrofluidic type seals that are commercially available. In either embodiment feedthrough 21 is sealed to mounting flange 20 by static O-ring seals 40. The water input/output arrangement 27a–27b allows high flow rates to remove waste heat for high power operation (i.e. high deposition rate). It includes tube 41, which provides cold water input to the target housing through opening 42. An internal tube (not shown) connects opening 42 to another opening in the bottom of magnet assembly 36. Water then flows along the face of magnet assembly 36 and exits at the top. Water then returns to output 27b through hole 43 in tube 28 along the annular passage existing between tube 28 and tube 26. An important feature of this design is that there are no dynamic seals between the water and vacuum to cause reliability problems.

In another embodiment of the invention, the apparatus is designed for high rate reactive deposition of, for example, dielectric thin films at low sputtering gas pressure with both conductive and insulating target materials. This apparatus includes dual magnetrons in a vacuum chamber and target protection from attack by the reactive gas. Further details of the apparatus and process for the high rate reactive deposition at low pressure are described and discussed with respect to accompanying FIGS. 2c and 2d. The cross-sectional view of the dual rotary cylindrical magnetron (e.g., FIG. 2c) illustrates the new embodiment within a vacuum chamber. Again, each magnetron includes the target 29, target backing tube 19, magnet assembly 36, support and water transfer tubes 28 and 41, and shields 16. During the sputtering operation, the target 29 along with the target backing tube 19 (when needed) are caused to rotate with respect to magnet assembly 36. Magnet assembly 36 supports a sputtering plasma in the region of arched magnetic fields 52 which causes target material to be deposited on a substrate 4 at position 18 (for example).

Previously, the shield 16 was described as an electrical anode with the implication that it would be constructed from a conducting material (usually a metal). In this embodiment, shield 16 may continue to act as an anode if required by a particular process, but it has an additional function that is important especially for reactive sputtering. In its new role shield 16 acts as an element which allows a thin "sputtering gas curtain", e.g., argon curtain, to exist in a narrow annular gap, G, around those regions of the target 29 which are not being sputtered during its rotation. For instance, argon sputtering gas may be introduced into tube 17 and allowed to flow (arrows) and divide to feed equally into each gap, G, at respective positions along each of the shields 16 that are approximately 180 degrees from the magnetic assembly 36. In each magnetron, the argon then flows around the target 29 and enters the sputtering area at the edges of cutout 16x. The reactive gas (oxygen for example) may be introduced near the substrate 4 preferably at positions 95a or, alternatively, at other positions 95b outside of shields 16. Deposition shield 96 prevents high angle, low energy sputtered material from reaching the substrate position. The heavy dashed arrows indicate the direction of gas flow toward vacuum pumps (not shown) which in this case are attached to a main vacuum chamber.

The importance of this embodiment lies in the fact that the sputtering gas total pressure in the vacuum chamber can be relatively low (e.g., of the order of a millitorr or less) while the sputtering gas pressure in gap, G, can be higher (e.g., a few millitorr). The higher pressure plus the sweeping action of the sputtering gas in the gap due to its flow keeps the region of the gap free of reactive gas. Thus the surface of the target 29 is maintained in a state substantially free of reactive gas products during the reactive sputtering operation. This allows the apparatus to produce superior quality dielectric films while maintaining a very constant process over the lifetime of the target tube. Added control sensitivity can be achieved by admitting the reactive gas into the system by way of a fast acting valve. Piezoelectric valves with response times of a few milliseconds or less are available and suitable for this purpose.

Figure 2C:
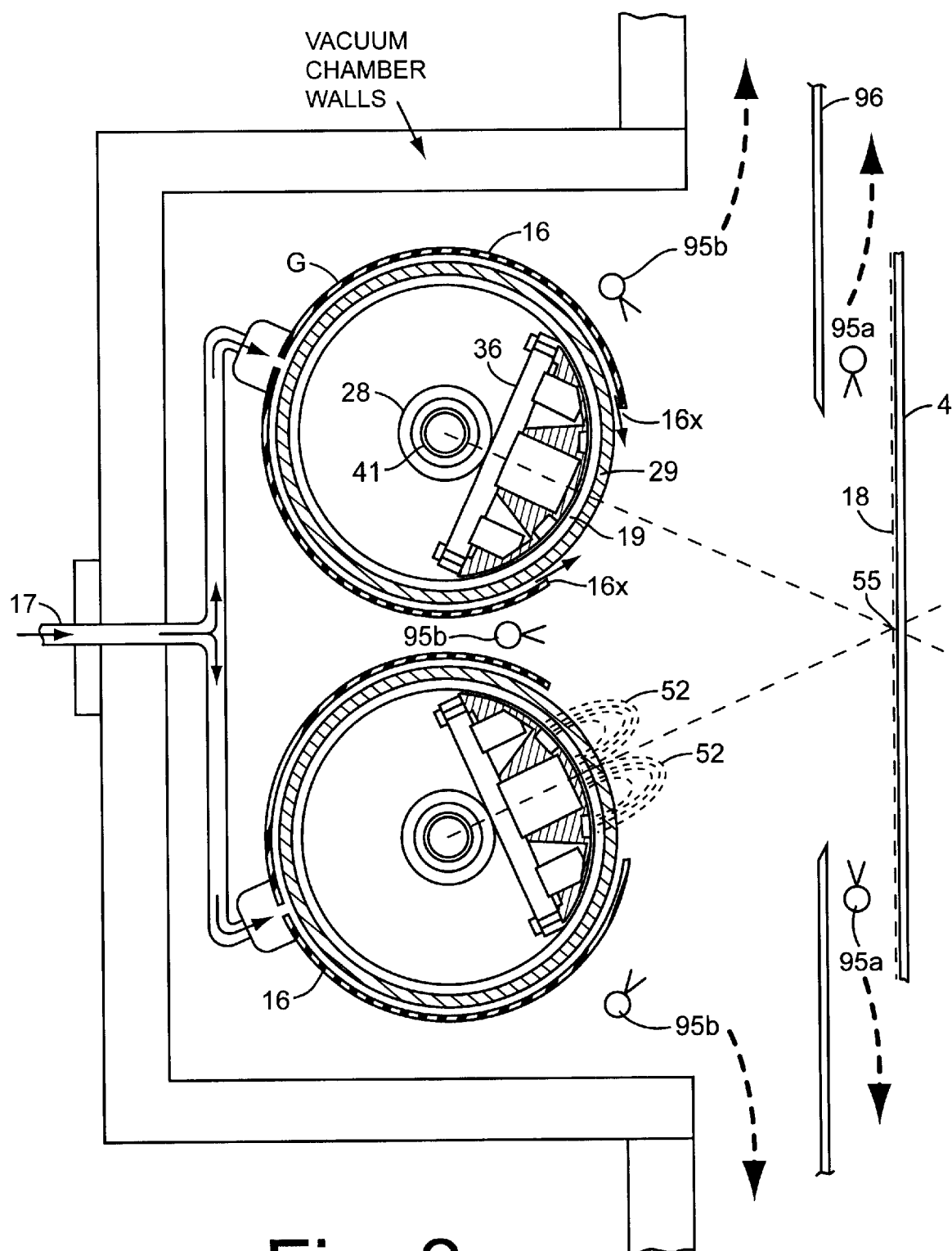
FIG. 2c shows a planar cross-sectional view of an apparatus with dual magnetrons for high rate reactive deposition at low sputtering pressure.
Figure 2D:
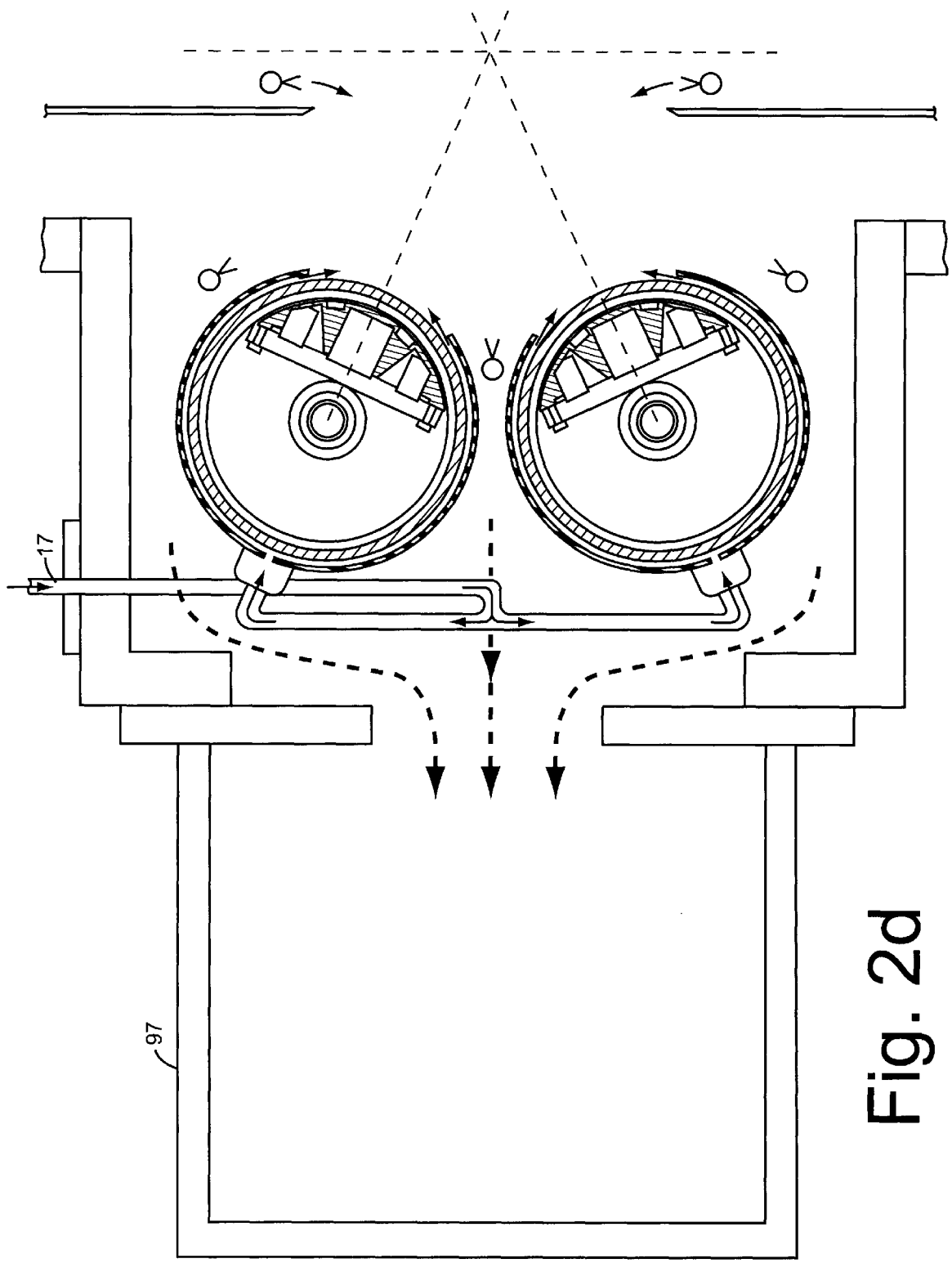
FIG. 2d shows a planar cross-sectional view of a second apparatus with dual magnetrons for high rate reactive deposition at low sputtering pressure.

The embodiment shown in FIG. 2d increases the local pumping capacity of sputtering gas in order to further improve process control. The magnetron setup is substantially identical to that shown in FIG. 2c except that argon input tube 17 has been moved to the side (or otherwise out of the way) to allow the mounting of turbomolecular pump 97 on the back of the magnetron chamber. Sputtering gas flow as indicated by the heavy dashed arrows is primarily into the local pump, rather than through pumps located on the main chamber. With this arrangement it is possible to increase the flow of sputtering gas, and at the same time keep the total pressure low. The higher flow at the low pressure improves the response time of the system to minor perturbations, and allows tighter process control.

Figure 3A:
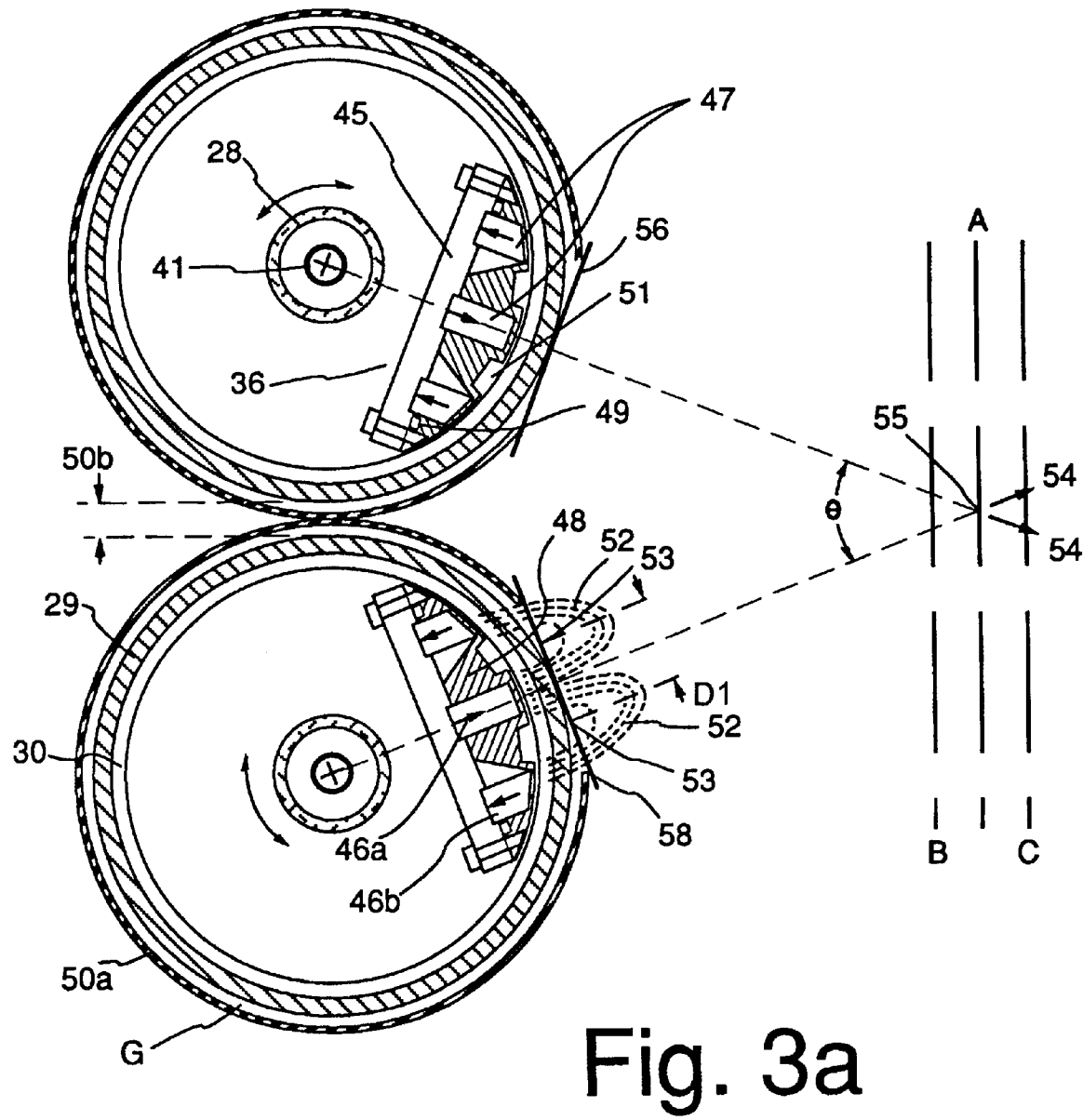
FIG. 3a shows a planar (horizontal) cross sectional view illustrating the design and construction details of the rotatable cylindrical magnetron used in the apparatus when implemented with dual rotatable cylindrical magnetrons. The spacing, D1, between the two erosion zones on each magnetron may be varied.

FIG. 3a shows a detailed cross-sectional schematic view of a set of cylindrical magnetrons, each of which was illustrated schematically in FIGS. 2a and 2b. The section is taken through the tubular targets to show the details of magnet assembly 36 of FIG. 2b. Elements common to those in the previous figures are labeled with the same numerals. Since the magnetron cross-sections are identical except for orientation, like elements are labeled only once. In conventional sputtering operations, magnet assemblies 36 are held fixed relative to the plane of the substrate, i.e., plane B or C in FIG. 3a. However, for some specialized coatings, magnet assemblies 36 may be rotated or "scanned" relative to the plane of the substrate in either direction as indicated by the double arrows in FIG. 3a. The magnet assemblies 36 may be scanned synchronized to each other or independently of each other. In one embodiment, magnet assemblies are mechanically linked to each other so that the scanning motion of each assembly is the same. In another embodiment, the magnet assemblies alternately scan over the substrate material. During scanning motion of a magnet assembly, the target continues to rotate with respect to both the magnet assembly and the substrate plane to improve target material utilization.

Each magnet assembly 36 consists of backing plate 45 constructed from a water resistant magnetic alloy, with center 46a and outer magnets 46b (arrows indicate direction of magnetization) and their associated magnet pole pieces 47. Pole pieces 47 aid in smoothing out the magnetic field produced by magnets 46a and 46b if they are constructed from an array of smaller individual magnets. Semi-circular, non-magnetic housing 48 is sealed to backing plate 45 by O-ring 49 to prevent corrosion of the magnets from exposure to coolant. The directions of magnetization of magnets 46 (indicated by arrows) may be reversed and the device will function equally well; however, all magnetron assemblies that are used in a given system usually have like magnetic orientation. Tubular targets 29 are surrounded by dark space shield 50a, which are open in the region of the plasma defined by the magnet assemblies. The gap G between dark space shield 50a and tubular target 29 is about 0.10 inches, a typical distance for sputtering at a pressure of a few millitorr. Shield 50a may be either electrically floating (as illustrated) or connected to system ground. In all configurations it shields those regions of the tubular target surface which have been substantially cleaned by their passage past the sputtering region. Additionally, when, as shown in FIGS. 2c and 2d, the shields 16 are electrically isolated from each other (as compared to the shields, e.g., 50a, shown in FIGS. 3a–c), such shields 16 may be driven in phase with the AC power source. Unlike the prior art taught in '195, these cleaned regions do not function as the anode or electrical return path during AC operation. The distance between the centers of the magnetrons is such that the surfaces of tubular targets 29 are separated by a distance 50b that is less than one inch and preferably about one-half inch. The distance 50b is much smaller than that taught in '195 and '751, but it is required to improve coupling between the magnetrons. Channels 51 in housing 48 help to direct coolant along the back of the heated erosion zones of the tubular target.

Magnets 46a and 46b are preferably of the rare earth (NeFeB) type, which have very high energy density. They produce arched magnetic fields 52, which define erosion zones 53 (one racetrack-type area). Magnet assembly 36 is intentionally constructed to minimize the distance between the center and outer magnets to produce narrow erosion zones with high magnetic field strength. The center magnets can be made twice as thick as the outer magnets to approximately balance the total north and south magnetic field energy. In order to optimize the distance, D1 (discussed later), between the parallel erosion zones, it may be necessary to separate the center magnets into two rows by a predetermined distance between them. In that case all the magnets should have the same thickness. This combination allows very high horizontal magnetic fields (more than 500 gauss) above target material 29 to enable low pressure, high power operation. Magnet assemblies 36 are oriented symmetrically toward each other. In FIG. 3a, source planes 56 and 58 are identified as containing the narrow erosion zones (approximating lines sources) and normal planes 54 perpendicular to the source planes and including the cylindrical axes of magnetrons intersect at point 55 which typically is a few inches from the magnetrons. The included angle θ between the normal planes is less than 90° for most substrate positions.

Dashed line A passing through point 55 in FIG. 3a illustrates a possible position for the substrate plane. For the purposes of the present invention, the plane through point 55, as suggested by the prior art, is not the optimum substrate plane. The substrate planes indicated by dashed line B (closer to the magnetrons) and dashed line C (further from the magnetrons) are potentially more optimum positions, but the exact location is dependent upon the details of the geometry and construction of the device. The diameter of tubular targets 29, the spacing D1 between the erosion zones, and the position of the substrate are chosen to provide both a relatively uniform distribution and efficient utilization of sputtered flux at the substrate.

Figure 3B:
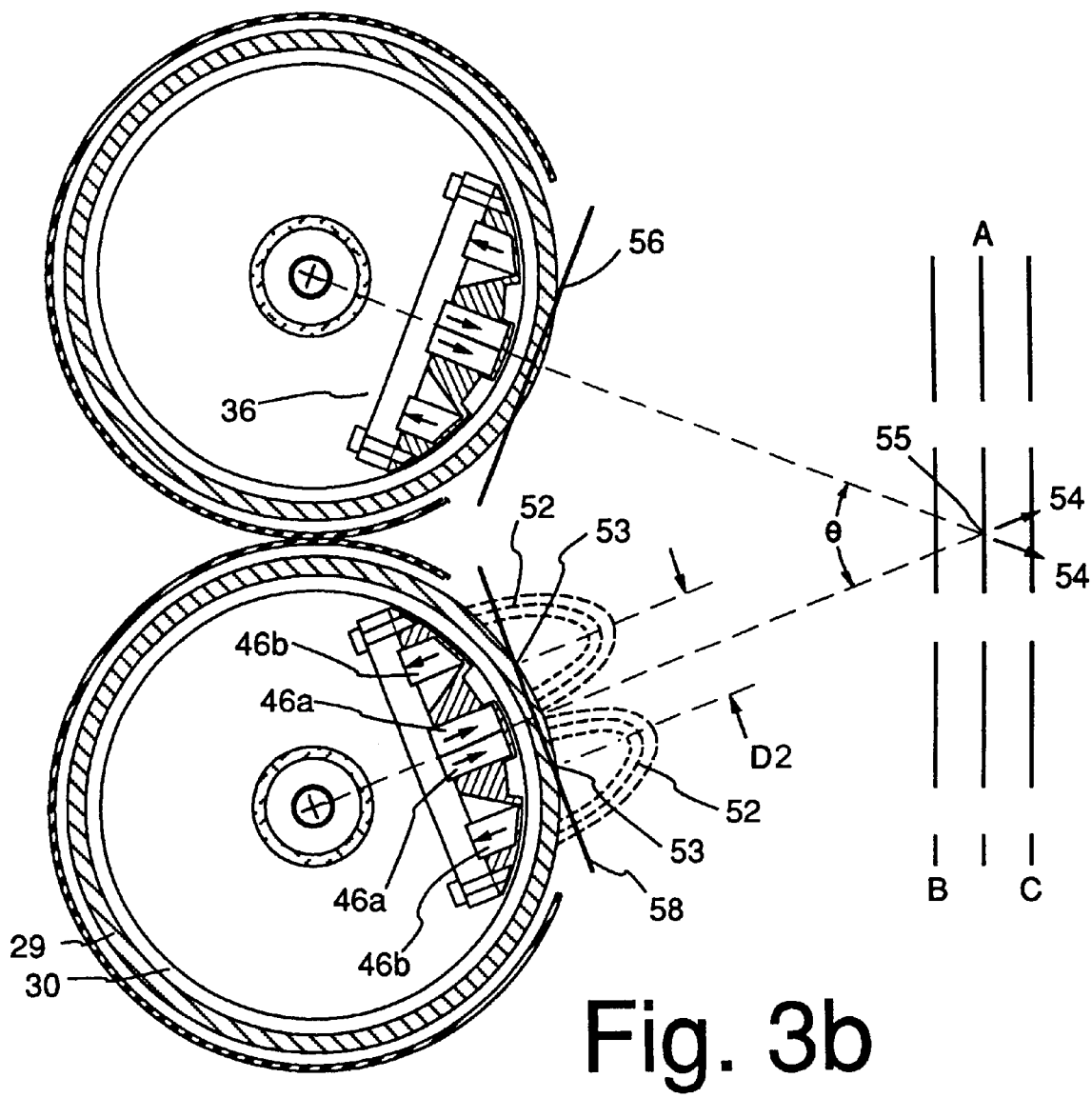
FIG. 3b shows a horizontal cross sectional view illustrating an alternative design for the magnet assembly which permits a variable distance between the narrow parallel erosion zones.

FIG. 3b illustrates schematically an alternate construction of magnet assembly 36 to increase the distance D2 between the erosion zones. In other respects FIG. 3b is similar to FIG. 3a with common elements labeled with the same numerals.

As indicated in the figure, central magnets 46a consist of two rows instead of one, and outer magnets 46b are the same thickness as central magnets 46a. The width of each erosion zone 53 formed by fields 52 is about the same as those in FIG. 3a; however the width D2 between the erosion zones is increased by approximately the width of magnet 46a. The width D2 may be further increased by increasing the diameter of tubular target 29 and backing tube 30 and by widening magnet assembly 36. The spacing between central magnets 46a and outer magnets 46b would remain the approximately the same to keep fields 52 and erosion zone 53 unchanged, but the double row of magnets 46a would be spaced apart.

Figure 3C:
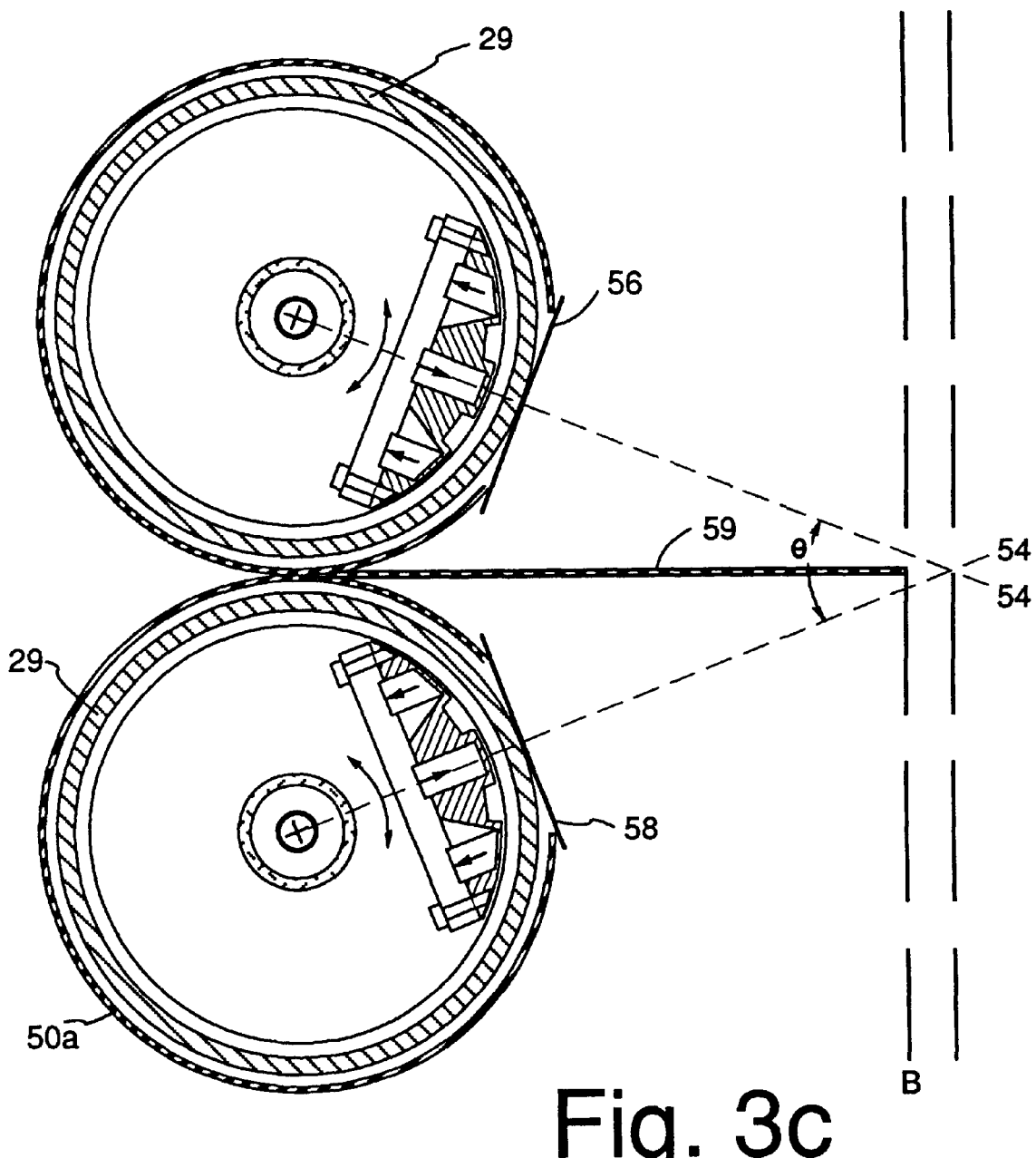
FIG. 3c shows a horizontal cross sectional view illustrating the use of the dual cylindrical magnetrons for coating a second layer of material epitaxially over a different first layer of material.

FIG. 3c illustrates using the dual cylindrical magnetron to deposit two different materials, one over the other. FIG. 3c is similar to FIG. 3a except for a central baffle 59 that extends from dark space shield 50a approximately to substrate position B, and target materials 29 are different from each other. As a substrate is transported along position B, it is first coated with a first layer of material up to baffle 59, and then immediately coated with a second layer of material on the other side of baffle 59. This minimizes the exposure of the first layer to background contaminants, and allows the second layer of material to form epitaxially on top of the first layer. An example where this type of deposition is important is the coating of a magnetic memory layer over its base chromium layer. Epitaxial coating growth at the interface is critical for obtaining the correct properties in the magnetic memory layer.

In one version of the invention especially suited to coating stationary substrates with alternating layers of material, baffle 59 is shortened in length enough to allow the substrate to be exposed to each of the magnetron erosion zones. Also, openings in shield 50a at the source planes 56 and 58 are enlarged to allow each magnet assembly to be oscillated without the shield interfering with the erosion zones as they follow the movement of each magnet assembly. The result of this oscillation is that normal plane 54, representing the principal direction of the target flux, is passed back and forth across the stationary substrate. Each magnetron in this version is fired successively with DC power as the magnet assembly is oscillated to overcoat a first material with a second material. This process can be repeated a number of times to build up multiple layers of alternating materials. During the oscillation of the magnet assembly, the tubular target is rotated as in other versions of the invention to assure even consumption of the target material during the deposition process.

Figure 4A:
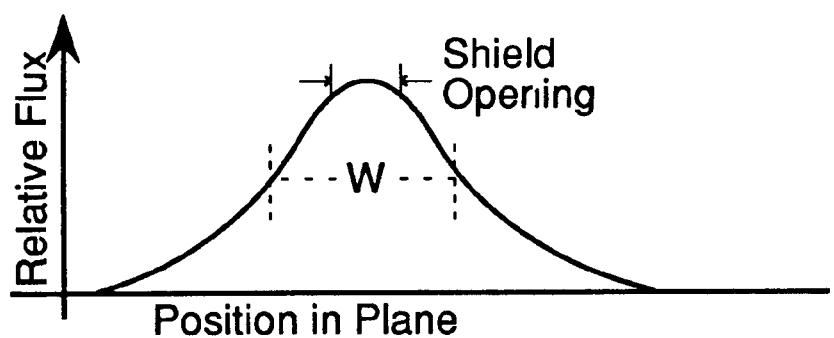
FIG. 4a shows a schematic diagram of the Gaussian-like distribution of sputtered flux in the substrate plane from one of the narrow erosion zones on a rotatable cylindrical magnetron, W being the total width of the distribution at one half of the peak height, and a shield opening being indicated schematically which would isolate a relatively small but approximately constant deposition region around the peak.

FIG. 4a illustrates schematically the relative distribution of sputtered flux from a single erosion zone on a plane perpendicular to normal plane 54 in FIG. 3a and located a few inches from the magnetron. The sputtered flux distribution has the approximate shape of a Gaussian curve. W indicates the width of the curve at one-half of the maximum flux. A shield opening near the substrate position is indicated through which a relatively uniform flux around the peak would reach the substrate. A constant partial pressure of reactive gas would yield a deposited film on the substrate that was substantially uniform in stoichiometry; however, the majority of the sputtered flux would not reach the substrate but be captured on the shield. This represents a very poor efficiency for the use of the available sputtered flux.

Figure 4B:
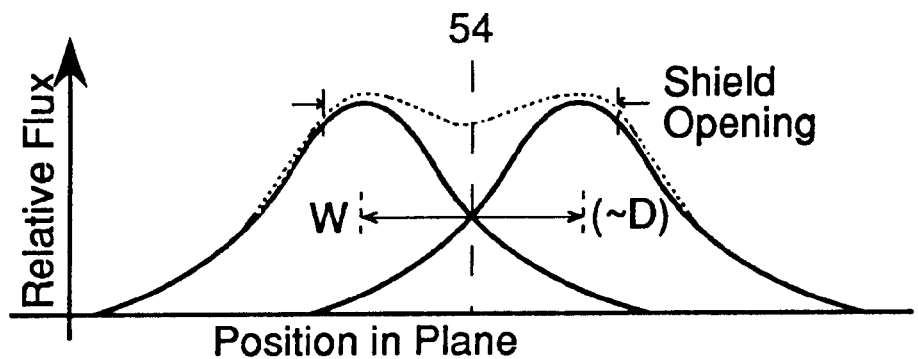
FIG. 4b illustrates schematically the optimum flux distribution at the substrate plane from the double erosion zones of one rotatable cylindrical magnetron.

FIG. 4b illustrates a means of obtaining a large improvement in the utilization of the sputtered flux. Here the Gaussian-like flux distribution of the second sputtering erosion zone on the magnetron is added to the first, but it must be offset by about the half width W. This alignment of the two distributions yields a relatively broad and uniform flux distribution at the substrate (dotted line) as indicated by the much wider shield opening compared to that in FIG. 4a. The efficiency of flux usage is more than doubled. To achieve this result it is necessary for the separation of the sputtering erosion zones on the magnetron (D1 in FIG. 3a) to be approximately equal to the width W of the Gaussian-like curve. The most direct way to determine the correct geometry is by measurement of the deposition uniformity produced by a magnetron in which the parameter D1 can be readily varied.

Figure 4C:
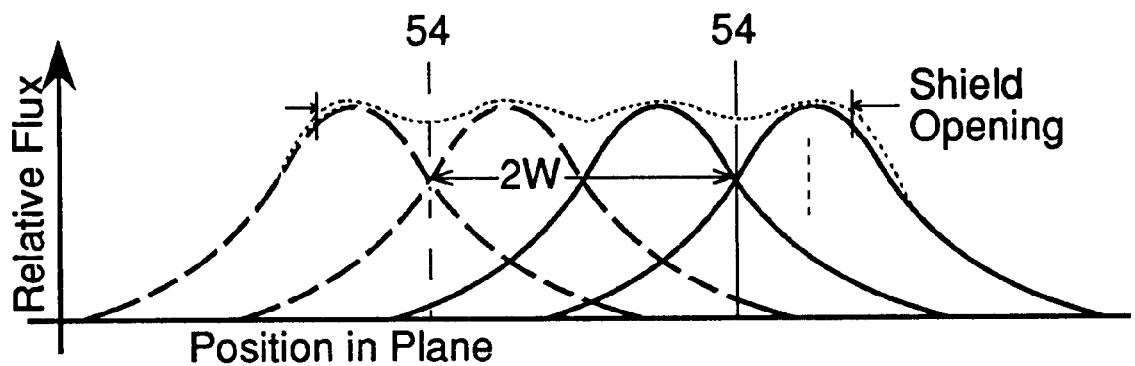
FIG. 4c shows a schematic diagram showing the optimum combination of flux distributions at the substrate plane for the distribution of FIG. 4b, the dashed lines corresponding to the flux distributions from one of the rotatable magnetrons and the solid lines corresponding to the flux distributions from the second rotatable magnetron, the shield opening indicated schematically isolating a wide and relatively uniform deposition zone.

After the individual magnetrons are designed and adjusted to produce the flux distribution shown in FIG. 4b, the layout for the dual version is completed by setting the included angle θ (in FIG. 3a) between the pair so that the centers of the distributions from each magnetron are twice the width W apart at the desired substrate position. FIG. 4c indicates this result schematically. The distribution from one magnetron is represented by the dashed curves, while that from the other is represented by the solid curves. The dotted curve shows the resulting flux distribution at the substrate with the relatively wide shield opening. The efficiency for uniform flux distribution in this arrangement is greater than 75% of the total flux available. For this arrangement to be possible, the substrate position must be near plane B or plane C in FIG. 3a. It can not be at plane A, where the normal planes 54 from the magnet assemblies intersect, without incurring a significant loss of efficiency or a reduction in uniformity of the film stoichiometry.

Figure 4D:
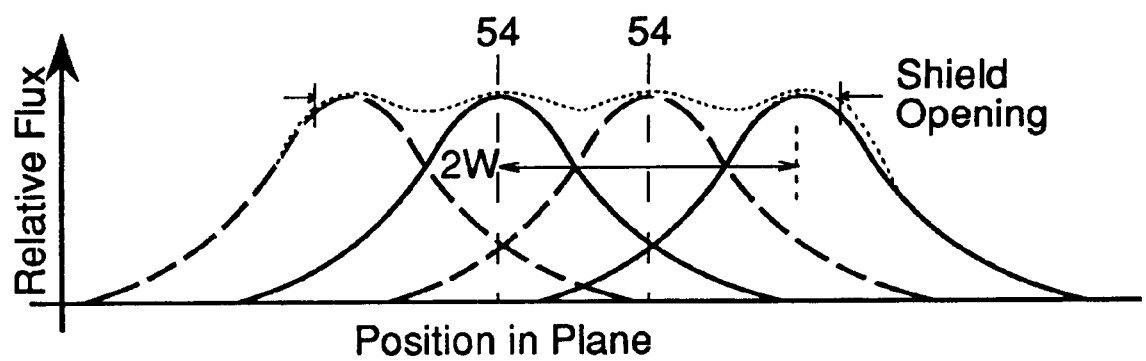
FIG. 4d shows a schematic diagram showing an alternative optimum combination of flux distributions at the substrate plane, the dashed lines corresponding to the flux distributions from one of the rotatable magnetrons and the solid lines corresponding to the flux distributions from the second rotatable magnetron, the shield opening indicated schematically isolating a wide and relatively uniform deposition zone.

By using two rows of central magnets in the design as previously discussed, the distance D2 between the erosion zones (FIG. 3b) can be increased. At about twice the original distance (i.e. twice W), the two Gaussian-like distributions from the two erosion zones are separated by approximately twice the width of either distribution alone. The angle θ (FIG. 3b) may be adjusted by a small amount to again provide a flux distribution at the previous substrate position equivalent to that shown in FIG. 4c. FIG. 4d illustrates the uniform flux distribution attained in this way. The two dashed curves represent the distributions from one of the magnetrons, while the two solid curves represent the distributions from the other magnetron. Each distribution is symmetrical about normal plane 54 (FIG. 3b), and they are offset with respect to each other by width W. As in the previous example, efficiency is lost if the substrate is placed at plane A (in FIG. 3b).

For the epitaxial deposition of a second layer on a first different layer as illustrated in FIG. 3c, each magnetron would be set up to deposit the pattern shown in FIG. 4b. Angle θ (FIG. 3c) would be adjusted to place the edge of a shield opening (shown in FIG. 4b) at the edge of baffle 59 (FIG. 3c). This will give the maximum amount of uniform deposition on each side of baffle 59 and a high coating rate where the first coating terminates and the second epitaxially formed coating begins.

Figure 5A:
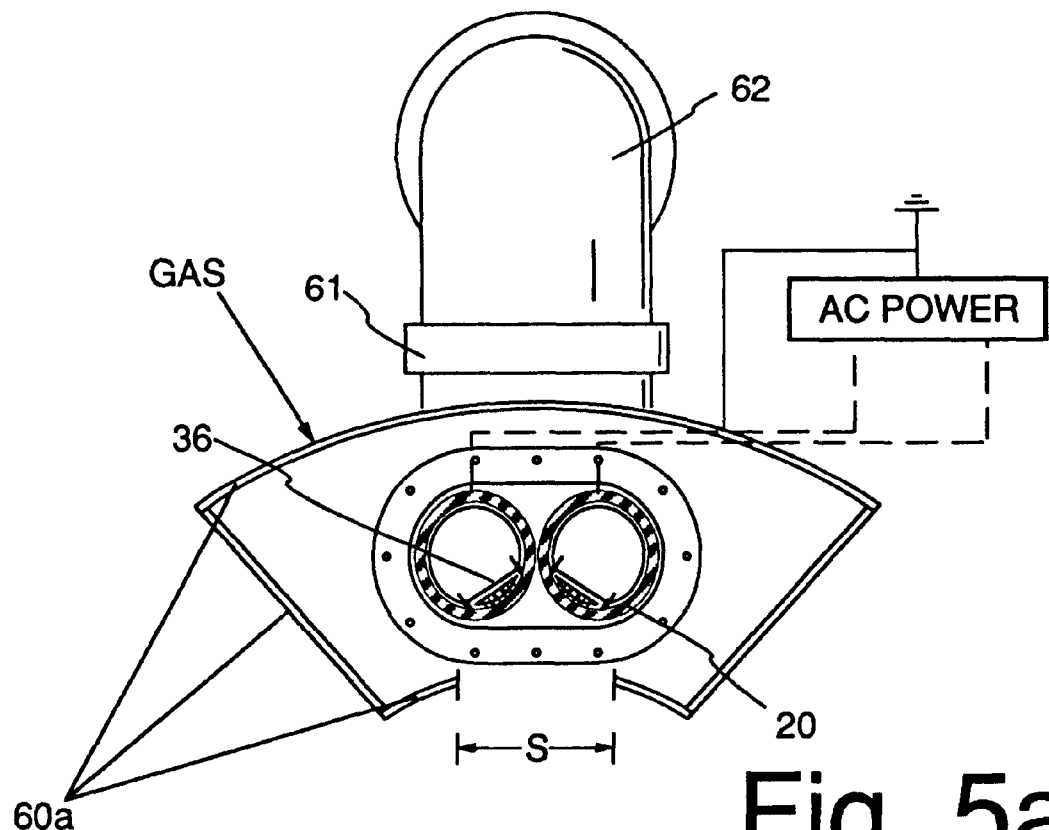
FIG. 5a shows a top planar view illustrating an embodiment of a basic sputtering module with dual magnetrons for use primarily in a batch coating machine.
Figure 5B:
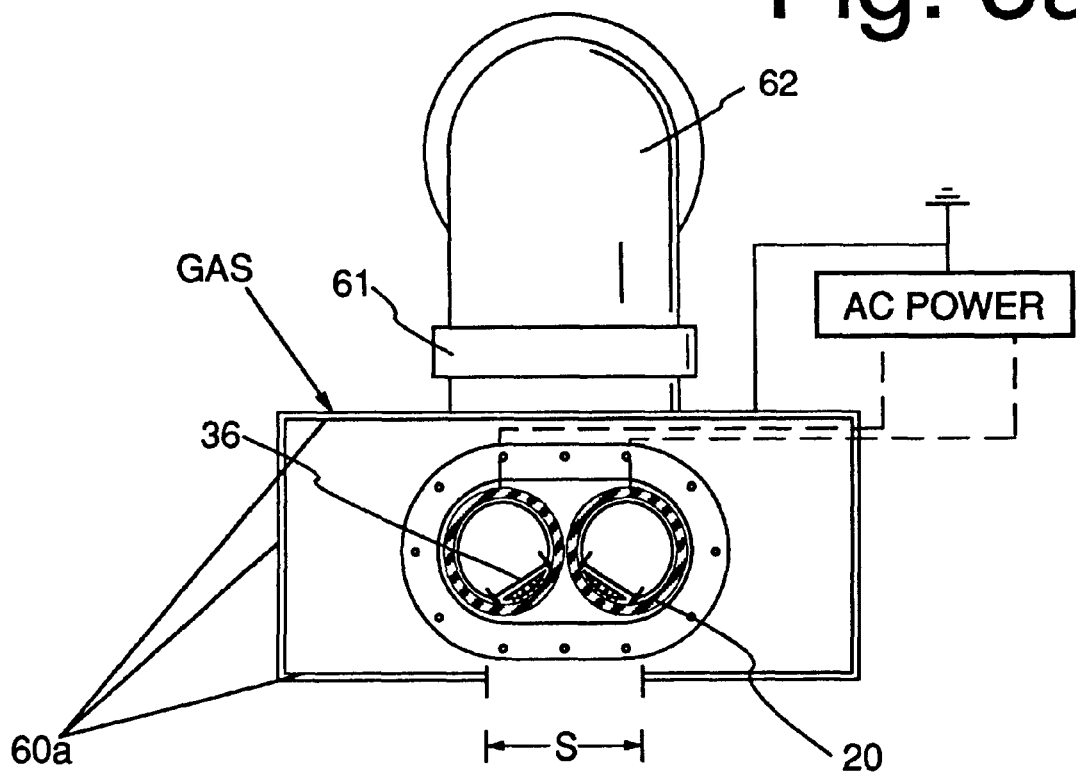
FIG. 5b shows a top planar view illustrating an embodiment of a basic sputtering module with dual magnetrons for use primarily on an in-line machine.

While this invention may be embodied in various forms, two basic examples of the sputtering apparatus (modules) are illustrated schematically in the top planar views of FIGS. 5a and 5b. They are basically identical in function, with the exception that the shape of walls and/or baffles 60a and 60b are adapted primarily for a circular array in the case of 60a, and for a linear array in the case of 60b. Each module is associated with vacuum valves 61 and pumps 62 which provide local pumping for atmospheric and sputtering gases within the enclosures defined by 60a and 60b. The enclosures may be formed by the walls of the vacuum chamber or may consist of baffles interior to a vacuum chamber. The dual rotatable cylindrical magnetrons are shown mounted on a common flange 20 with magnet assembly 36 angled toward each other and toward shield opening S, which allows sputtered flux to reach a substrate. The magnetrons are operated by AC power connected across the pair as indicated. The introduction of sputtering gas into the sputtering enclosure is not as sensitive to position in this invention as it is in much of the prior art. Gas injection (indicated schematically by the arrow labeled "Gas") through the rear wall is convenient. Inside the machine, the gas may be further routed via tubing (not shown) to positions between the magnetrons and shield opening S, and to one or both sides, for release along the length of the magnetrons. Baffling between the targets and the substrate with independent injection of the gas to separate the partial pressures of sputtering and reactive gas as practiced in the prior art is unnecessary. For safety reasons both the power supply case and the machine should be connected to a common ground.

The dual magnetrons will operate with any combination of steady and/or pulsed DC or AC electrical power; however, for the deposition of dielectric films, AC mode is preferred because it provides long term process stability and greatly reduced arcing. An additional benefit of AC power over DC power is that roughly half the flow of reactive gas is all that is required with AC power to obtain the same deposition rate and coating stoichiometry. The frequency of the AC supply is typically from ten to hundreds of kilohertz, depending upon the coating application. The low end is chosen to be faster than the plasma recombination time so that the plasma does not totally extinguish between alternate negative cycles of the AC power.

In principal, the sputtering process is stabilized and controlled by fixing a set of parameters for a particular coating. The important parameters consist of pumping speed, argon (i.e. sputtering) gas flow, reactive gas flow, and power supply voltage, all of which are simply held constant during deposition. Under these conditions, a small change in the control voltage level, with all other parameters remaining unchanged, results in a small but stable and repeatable change in film stoichiometry. This is strictly true only if the machine geometry is fixed in time, primarily meaning that the substrate is not moving during deposition. If the substrate is moving, or if any other changes in system geometry occur during deposition, then the pumping speed can change. In practice, pumping speed changes during substrate motion can be minimized by system design, as taught in this invention however, they can not be totally eliminated. To compensate for the effect of substrate motion on pumping speed, the reactive gas flow is servo controlled to hold the total discharge power approximately constant at the same time that the power supply is operated at constant voltage. Alternatively, the servo control can hold current constant, which is equivalent to holding power constant since the voltage is fixed. This provides a fine tuning aspect for the control system, which is most beneficial when coating large substrates in a pass through system. It is less useful in DC mode, because arcs drive the reactive gas control loop into instability and oscillation.

The rotational speed of the magnetrons should be above a certain average threshold, which is determined by factors such as power level, reactive gas flow, and the plasma density in the erosion zone as previously discussed. It is best determined by experimentation, but in principle, it is selected so that only one or two monolayers of reactive product build up on the target during one rotation. Thicker layers lower the sputtering rate and increase the chances of arcing. In practice rotation rates between approximately 10 and 100 RPM are above the threshold depending upon the reactive properties of the material being sputtered. It is convenient to rotate each magnetron of a dual set at the same speed, but it is not a requirement.

Figure 6:
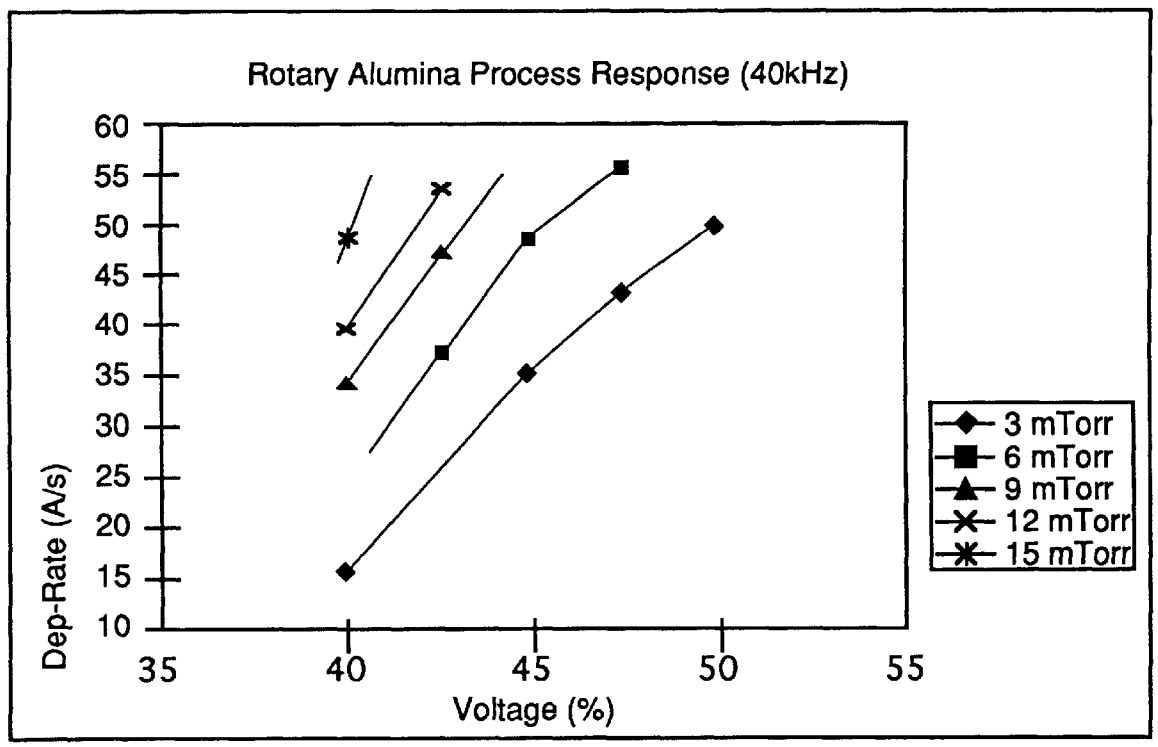
FIG. 6 shows a plot of deposition rate vs. discharge voltage at different pressures for insulating aluminum oxide coatings using the process and control features of this invention.

As an example of the process control that can be achieved with this invention, the results for the deposition of aluminum oxide from a single pair of rotatable cylindrical magnetrons are presented graphically in FIG. 6. The plot shows the deposition rate for aluminum oxide films in units of Angstroms per second as a function of control voltage in percent of full scale. The total sputtering pressure ranged from 3 millitorr to 15 millitorr with the oxygen partial pressure being only a small percentage of the total pressure since the process substantially consumes it. At each voltage control point the oxygen flow was adjusted to keep the total power constant at 2 kilowatts per magnetron. The magnetrons were operated at a rotational rate of about 40 RPM; however, the process was stable over a range of rotational speeds. The films made at 3 millitorr and 50% voltage, and 6 millitorr and 47% voltage were slightly absorbing, while all of the others were optically clear. All were electrically insulating. As sputtering pressure increases, the films becomes stoichiometric (i.e. just clear) at proportionally lower voltages, essentially tracking the normal drop in plasma potential with increasing pressure. Competing methods for depositing aluminum oxide by RF diode and RF magnetron sputtering claim deposition rates of between 1 and 4 Angstroms per second, more than an order of magnitude less than the present invention.

Figure 7:
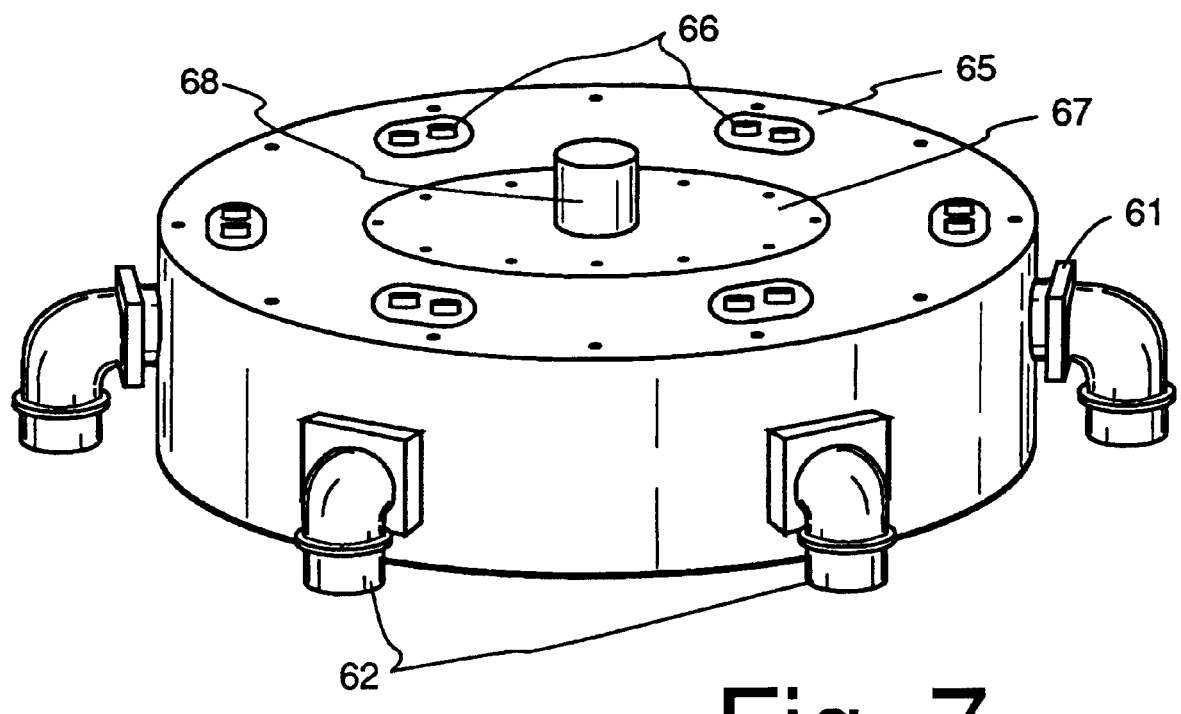
FIG. 7 shows a three dimensional perspective view illustrating an embodiment of the apparatus with sets of dual magnetrons useful for coating wafer-like substrates in a continuous circular mode.

FIG. 7 is a perspective view of a sputtering apparatus composed of the equivalent of six of the modules described in FIG. 5a. Elements common to those of previous figures are labeled with the same numerals. The apparatus consists of circular vacuum chamber 65 with sets of vertically mounted dual cylindrical rotatable magnetrons 66 mounted around the periphery. The sets of magnetrons are associated with vacuum valves 61 and pumps 62 placed on the outer circumference of chamber 65 and radially aligned with the magnetrons. The close association of a pump (or pumps) with each magnetron pair, along with internal shields and baffles (not visible), defines a relatively localized sputtering enclosure or module as shown in FIG. 5a. This arrangement minimizes changes in pumping speed during substrate motion, which is desirable for process control. A removable lid or flange 67 carries a substrate holder (not seen) which is rotated by motor 68. The diameter of vacuum chamber 65 may range from approximately two feet to several feet depending upon the coating application. This embodiment of the apparatus is useful for batch coating of wafer-like substrates used for thin film recording heads and integrated circuits. While the preferred embodiment has the magnetrons mounted vertically to minimize particulate contamination at the substrate, the machine would still function if the entire unit were mounted on its side (turned 90°) causing the magnetrons to be positioned horizontally.

Figure 8A:
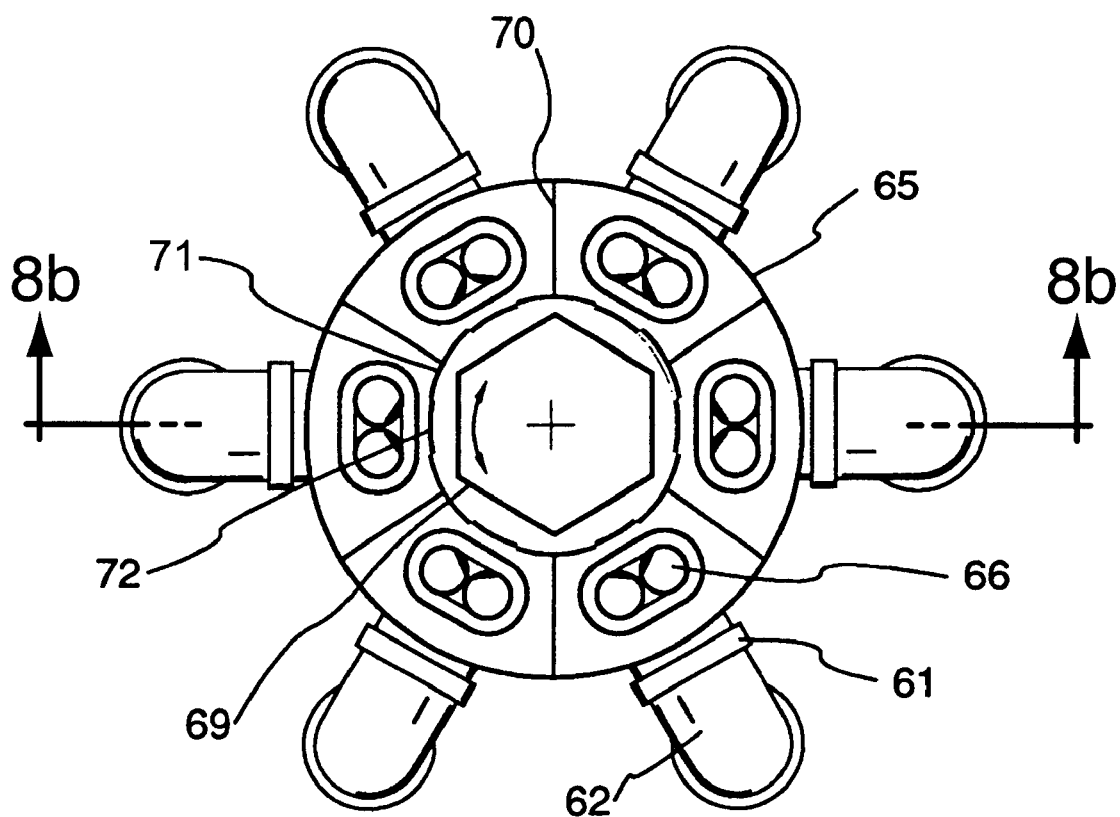
FIG. 8a shows a top planar view of the embodiment of the apparatus shown in FIG. 7.
Figure 8B:
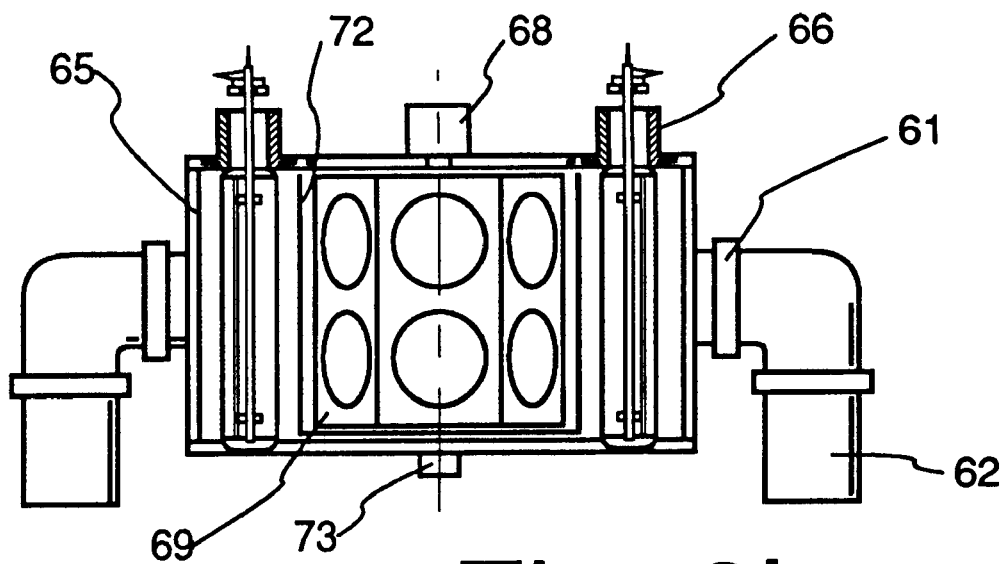
FIG. 8b shows a side planar view of the embodiment of the apparatus shown in FIG. 7.

A planar top view of the sputtering machine illustrated in FIG. 7 is shown schematically in FIG. 8a. For clarity, a planar vertical view of the same machine is given in FIG. 8b. Features common to those noted in FIGS. 5a and 7 are labeled with the same numerals in both figures. The machine comprises six of the basic sputtering modules described in FIG. 5a. Additional details include rotating substrate holder 69, which has six equal sides for mounting the substrates to be coated. However, it could take other shapes (octagonal, circular, etc.) so long as it can be rotated relative to the magnetrons during deposition as indicated by the curved arrow. It includes internal passages (not shown) for substrate cooling by a similar feed through mechanism as described for the rotatable magnetron in FIG. 2b. Holder 69, as depicted in FIG. 8b, is high enough to accommodate two rows of round substrates; however, the height of the machine may be shorter or longer than shown to coat a different number of rows of substrates. Internal, symmetrically positioned, vertical panels or baffles 70 provide semi-isolation of the common sputtering gas partial pressure between pairs of magnetrons. They define the walls between the six basic sputtering modules. This degree of isolation is adequate to allow independent process control. Additionally, panels 70 may be engineered to provide extra support against deflection of the top and bottom plates of the machine when they are under load from the vacuum. This allows construction with thinner materials to help reduce the overall weight of the machine.

Symmetrically placed curved panels 71 form shields, which are a part of the shutter system for control of the sputtered flux. They should be removable for cleaning and may or may not be rigidly attached to panels 70. Six symmetrical panels 72 form a rotatable shutter, which is closed (position illustrated) for target startup and stabilization, and later opened for the coating operation. This shutter may be formed by cutting six symmetrical openings out of a thin wall cylinder. The openings correspond in shape to the openings between fixed panels 71. Rotating the shutter cylinder 30° from the indicated closed position aligns shutter panels 72 radially with fixed panels 71, thus opening the shutter to allow the sputtered flux to reach the substrates. Rotatable shutter 72 may be placed interior to the circle formed by shield panels 71 as illustrated, or it may be placed exterior to the circle formed by shield panels 71 for embodiments in which it would not interfere with baffles 70 when opened. Shutter cylinder 72 is rotated by actuator or motor 73 (FIG. 8b). The substrate location and the shield openings between panels 71 correspond to the previously discussed geometrical requirements for producing a uniform and highly efficient flux distribution at the substrate position.

Sputtering gas (usually argon) and the reactive gas are preferably introduced near each set of dual magnetrons 66 as described in FIG. 5a. Because of the rotation of the substrates past the magnetron sources, and because of the symmetrical geometry of the apparatus, each substrate receives sputtered flux at angles from 90° to its surface to less than 45°. In this way step coverage is achieved over substrate topology while the system is operated at low sputtering pressure, high power, and high deposition rates. Such high energy, reactive magnetron coatings at high deposition rates, and with good step coverage have not been possible with prior art equipment and processes.

Figure 9A:
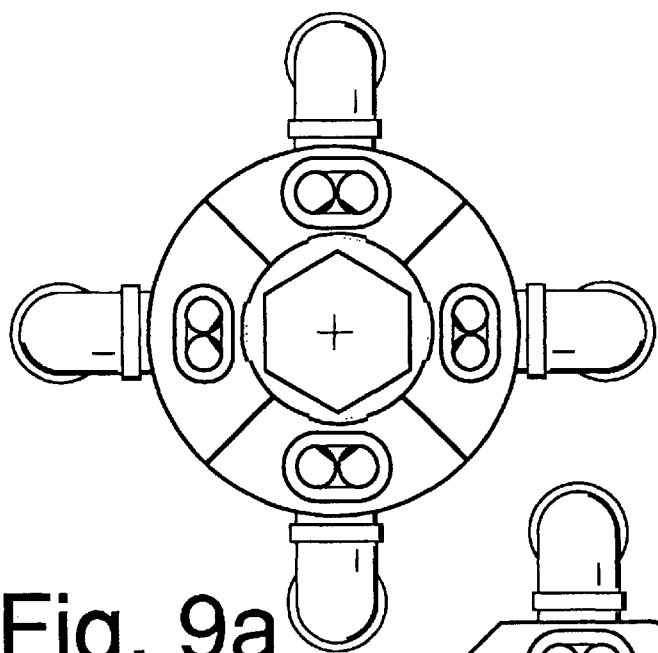
FIGS. 9a, 9b, and 9c shows top planar views illustrating alternative embodiments of the apparatus using different shapes for the vacuum chambers.
Figure 9B:
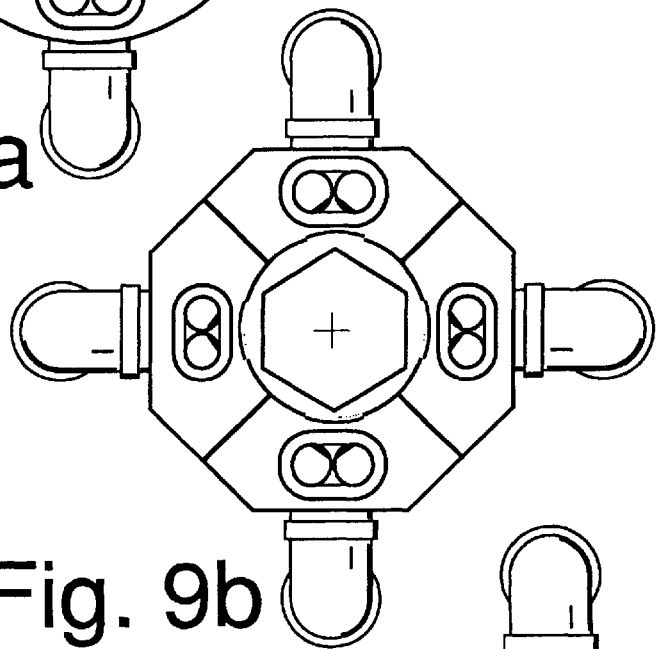
Figure 9C:
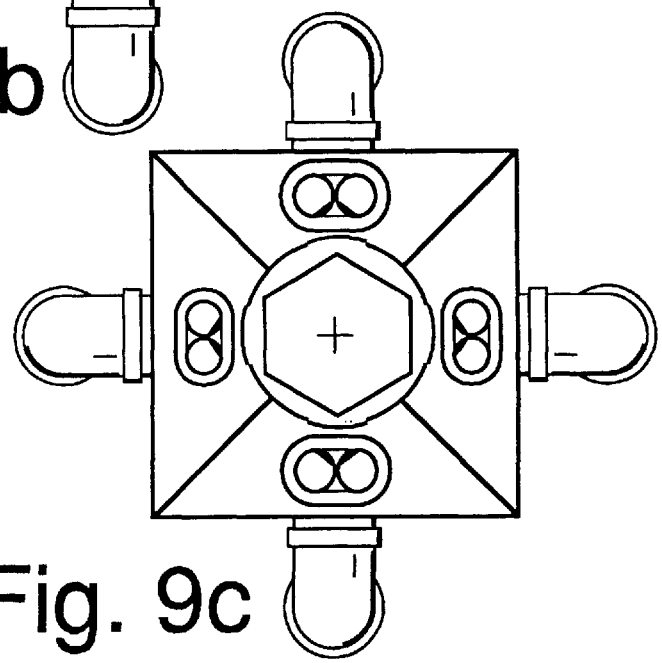

Acceptable variations in the machine design include but are not limited to the number of dual magnetron sputtering sources and the shape of the vacuum chamber. FIG. 9a shows a top planar view of a machine with only four sets of dual rotary cylindrical magnetrons and their associated basic sputtering modules. In all other aspects it is practically identical to the machine in FIG. 8a in both form and function. The vacuum chamber need not be circular, although circular is preferred. FIGS. 9b and 9c illustrate alternative polygonal forms (octagonal and square respectively) for the vacuum chamber in the case of four pairs of magnetrons. Other shapes would be appropriate for machines with different numbers of magnetron pairs. For a particular coating application the number of magnetron pairs, chamber shape, shield widths, substrate holder shape, etc. are chosen to meet the specific requirements of the coating, which could include very high net deposition rates, special step height coverage, and tight control of stoichiometry.

Figure 10A:
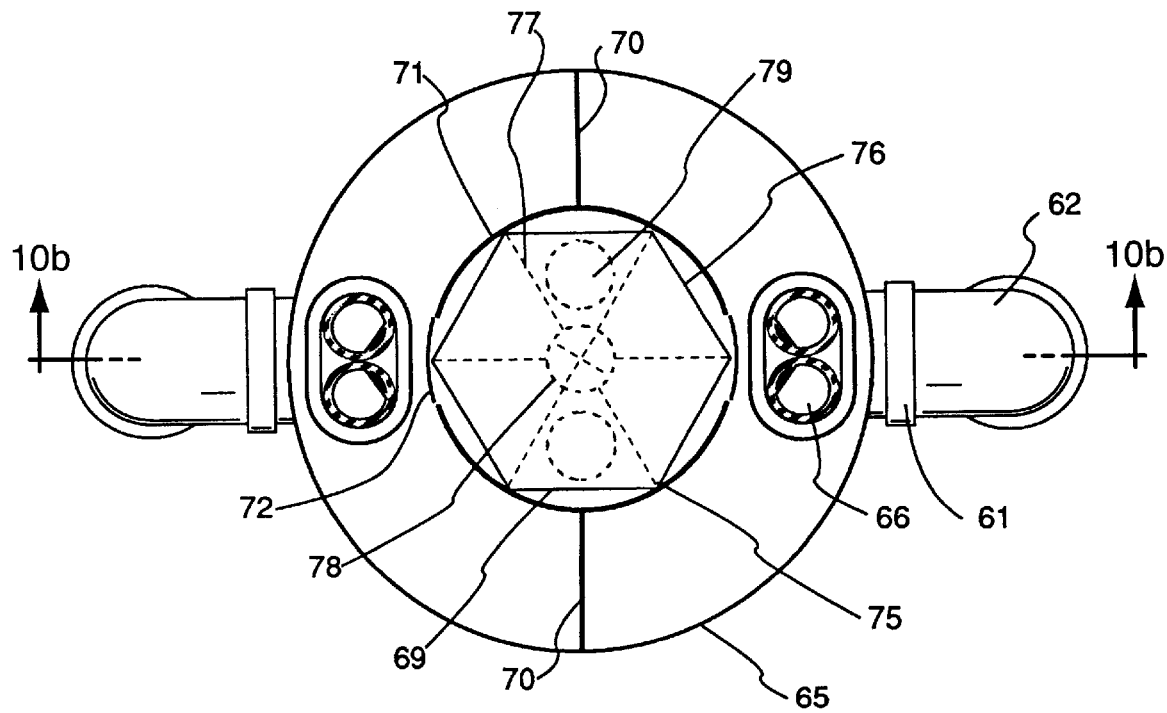
FIG. 10a shows a top planar view of an embodiment of the apparatus illustrating gas isolation between two sets of dual rotatable cylindrical magnetrons.
Figure 10B:
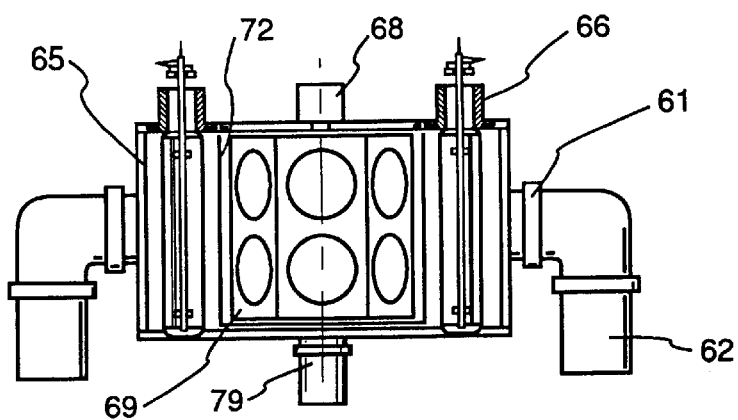

Other coating requirements could place more stringent demands on the process than those considered previously. For example, it may be necessary to coat a substrate with alternating layers of different materials, such as an oxide and a nitride. In this case, process isolation and control would require better physical separation of the different coating regions of the machine to isolate the oxygen that is injected near one set of magnetrons from the nitrogen that is injected near another set. FIGS. 10a and 10b illustrate planar top and side views of an embodiment of the machine design which provides improved separation for different process gases. Elements, which are common to those shown in FIGS. 7, 8a, and 8b, are designated by the same numerals. FIG. 10a shows the modifications necessary to provide for process isolation. These include placing curved panels 71 in close proximity to substrate holder 69 in such a manner that corners 75 of holder 69 form dynamic seals by maintaining a closely spaced but non-contact relationship to curved panels 71. Panels 70 still provide barriers between curved shield panels 71 and the outer walls of the machine, and they should fit tightly against the top and bottom of the machine as in the previous examples. Substrate holder 69 should have enough corners so that at least one seal 75 always exists along any path from one process region to any other. While substrate holder 69 rotates during the process, a volume 76 is formed which can trap process gases at one deposition module and transport them to another. In addition, if the height of substrate holder 69 is less than the internal height of the main vacuum chamber, openings will exist along the top or bottom or both that will permit the undesired mixing of process gases. To prevent this mixing of gases, vanes 77 attach to a central circular vane 78 (at the top and bottom of substrate holder 69) to form top and bottom dynamic barriers. Additionally, these vane structures form trapped volumes which connect to volumes 76. As the holder rotates these trapped volumes are evacuated by a set of pumps 79 (for example turbo-pumps) which prevent cross contamination of the gases.

The design concept described above is useful not only for coatings with alternating layers of different materials, but also for coating of the same materials if the system characteristics make process control more difficult by increasing the degree of cross talk between modules. This condition can occur if the pumping speed is reduced enough that the chemical pumping caused by the process (i.e. gettering) is a sizable fraction of the available system pumping speed. In some systems this could occur if the deposition rate were increased without concurrent increases in pumping speed, or if for some reason the pumps were restricted by other structures.

Figure 11:
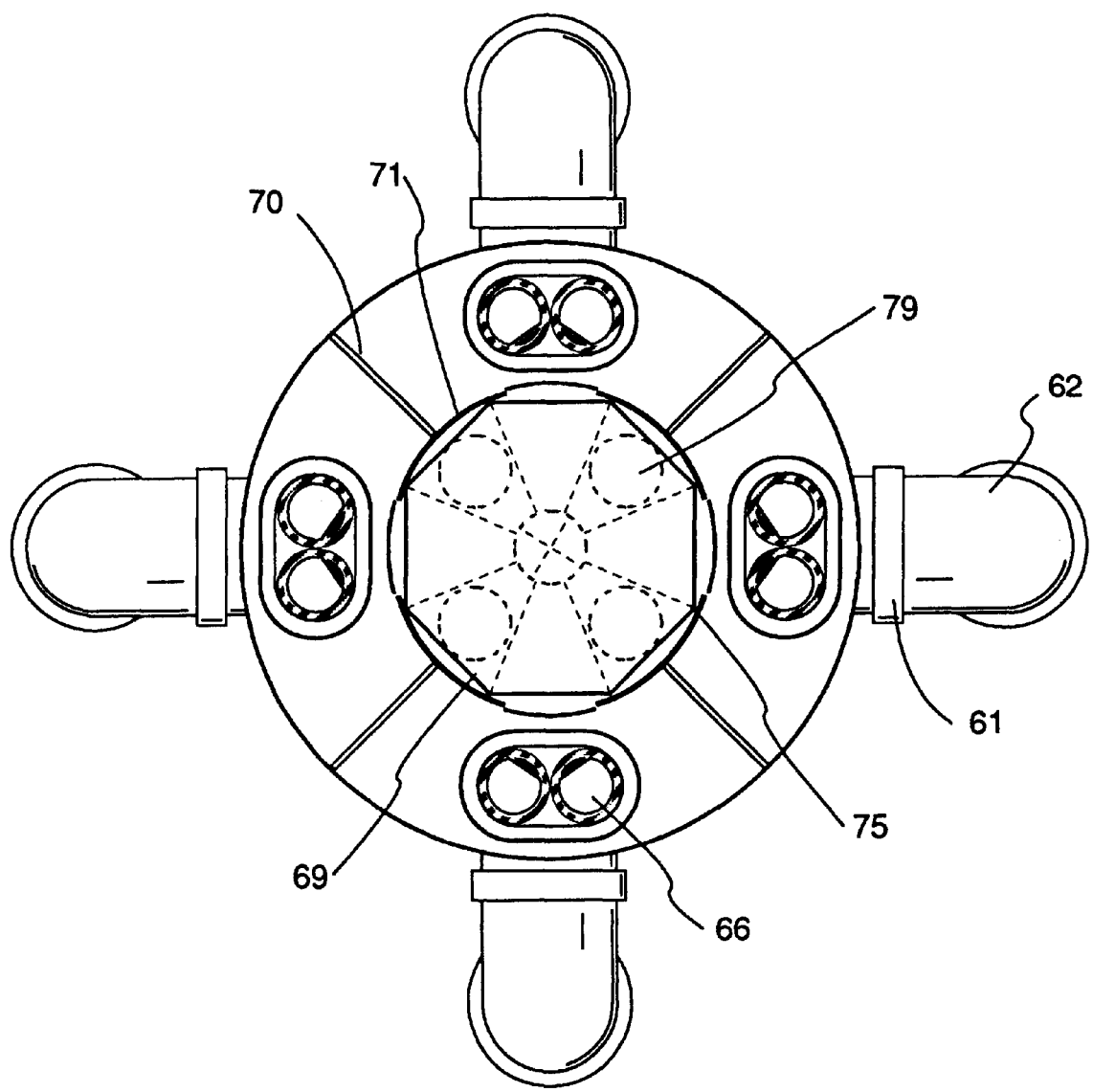
FIG. 11 shows a top planar view illustrating an embodiment of the apparatus for gas isolation between four sets of dual rotatable cylindrical magnetrons.

The above example for coating alternating layers of different materials, or for improved process control was shown for a system with two pumps and two dual rotatable magnetron sources (i.e. two basic modules). However, the concept is extendible to larger numbers of pumps and sources. FIG. 11 shows a top planar view of an example of the design for four pumps and four dual rotatable magnetron sources (four basic modules). To maintain proper process gas separation, substrate holder 69 has been modified to have eight sides instead of the previous six, so that at least one of the seals formed by corners 75 are always actively engaging panels 71 during process. In addition, more trapped volumes exist which must be evacuated by four pumps 79 instead of the previous two.

Figure 12:
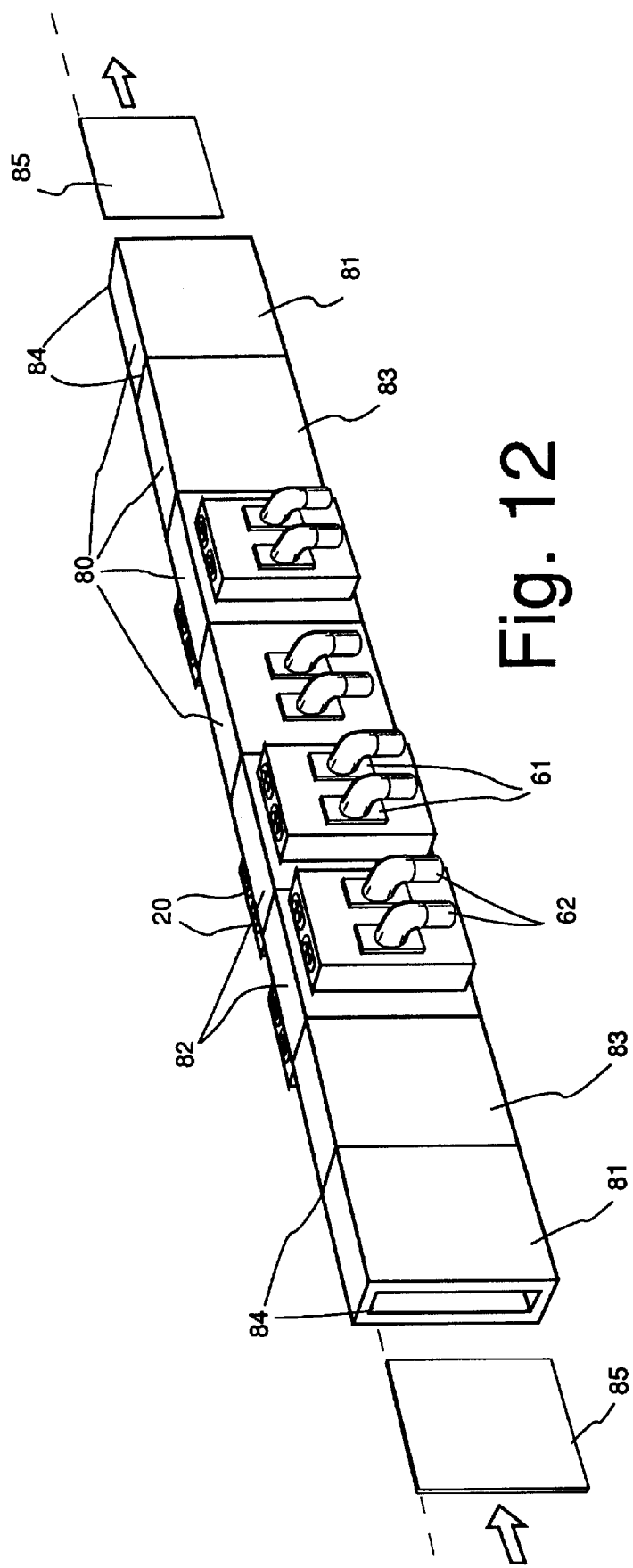
FIG. 12 shows a three dimensional perspective view illustrating an in-line embodiment of the apparatus with sets of dual magnetrons for coating relatively large flat substrates in a single pass.

FIG. 12 illustrates a conceptual design of a second embodiment of the apparatus for coating relatively large flat substrates in an in line pass through mode. The coating machine is shown as an assemblage of individual chambers 80 which, with appropriate modifications, function as load lock and unload lock chambers 81, deposition chambers 82, and auxiliary chambers 83 that are used for other process steps (examples include heating, etching, and annealing). When chambers 83 are positioned between deposition chambers 82, they become buffer chambers with additional pumps for process separation. With the exception of the load and unload chambers 81, the remainder of the machine alternately could consist of a single long chamber with appropriate internal divisions to separate the functions. At a minimum the machine must have vacuum isolation valves or doors 84 on each end of load and unload chambers 81 for passing substrates from air to vacuum for processing and finally back to air. Relatively large flat substrates 85, with dimensions of up to several feet, are made to pass through the machine by a mechanical or magnetic levitation transport mechanism (not seen in the figure). Deposition chambers 82 are fitted on each side with pairs of vertically mounted dual rotatable cylindrical magnetrons 20, and their associated vacuum valves 61 and pumps 62, which are appropriate linear arrays of the sputtering modules shown in FIG. 5b. Although the machine is illustrated with two pairs of dual rotatable magnetrons (i.e. two modules) per side on an individual deposition chamber 82, single modules or more than two modules are also acceptable embodiments.

Figure 13:
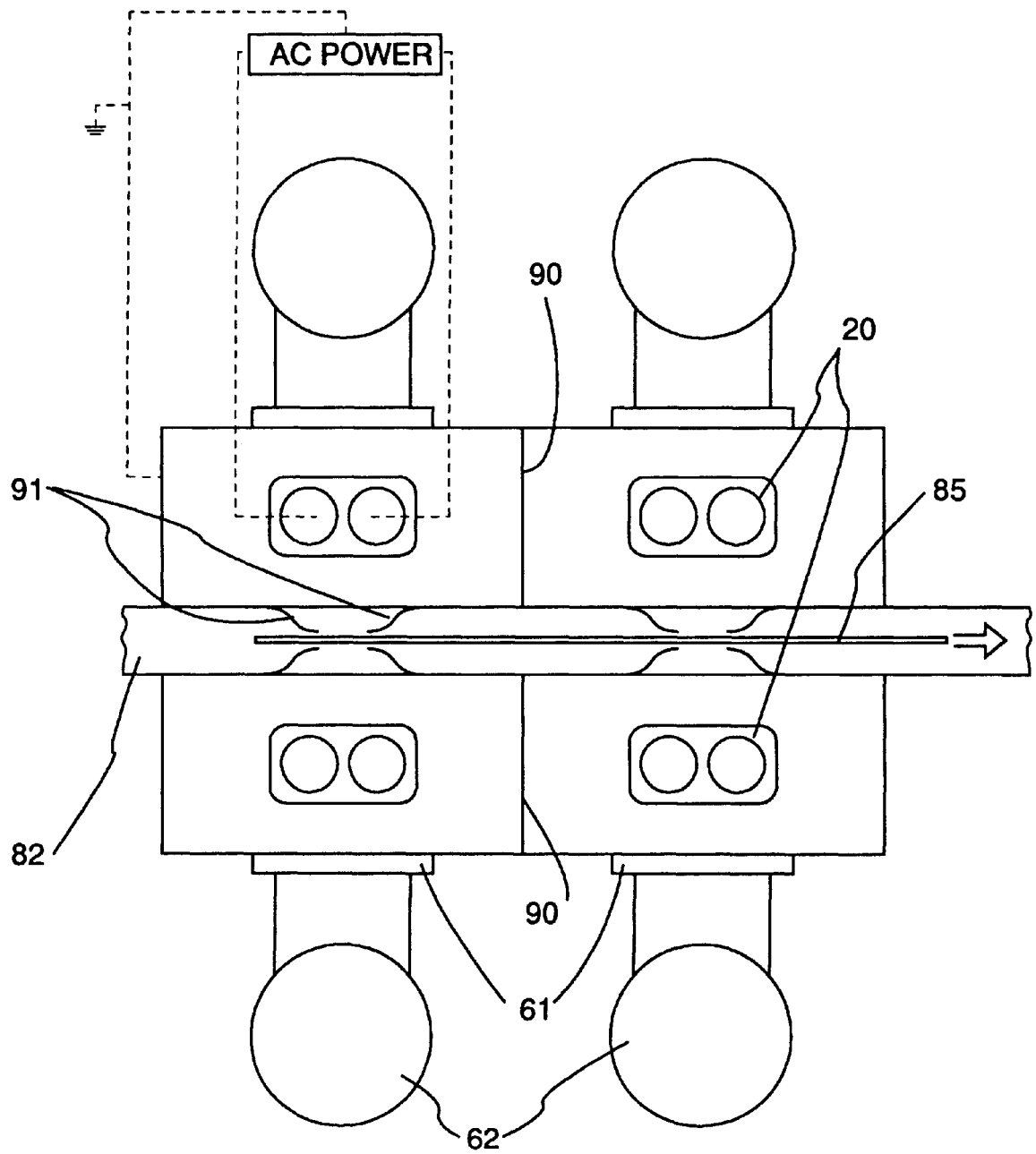
FIG. 13 shows a top planar view of the deposition region of FIG. 12 showing details of the dual cylindrical magnetron sputtering modules.

FIG. 13 is an enlarged, more detailed, planar top view of a deposition process chamber 82 of FIG. 12. Elements in FIG. 13, which correspond to elements previously labeled in FIG. 12, are given the same numerals. The deposition process chamber comprises the equivalent of four of the basic sputtering modules described in FIG. 5b attached to chamber 82 which contains a section of the substrate transport mechanism. The dual rotatable cylindrical magnetrons 20 are indicated as being mounted on a common flange as before. Although this is not necessary, it is convenient for removal and maintenance, as well as for holding accurate alignment between the magnetrons. An AC power source is connected across each pair of magnetrons with the safety ground as indicated before in FIG. 5b. In this embodiment internal panels 90 provide semi-isolation of the gas environment between pairs of dual magnetrons to form a pair of basic sputtering modules. Alternatively, panels 90 could be constructed as separate vacuum walls, allowing each set of magnetron modules to become independently mountable units. Shields 91 are designed and installed to meet the requirements (previously explained) for a highly uniform flux distribution at substrate 85 as it passes by (indicated by the arrow) the deposition sources. Any mixing of sputtering gas or process cross talk between the process control systems of the sputtering modules is limited to that which may occur as a result of the openings in shields 91.

If the coating is of only one type, an oxide for example, the four sets of modules as shown in FIG. 13 can be independently controlled, and any number of similar modules may be linked directly together. However, if an oxide coating is to be followed with a nitride (or other unmatched reactive) coating, then the nitride modules should not directly follow the oxide modules. A buffer chamber, as shown in FIG. 12, containing its own vacuum pumps and partial pressure separating baffles would have to be placed between the oxide and nitride process modules to prevent cross contamination and allow the controls to operate independently.

The Apparatus with Triple Rotatable Cylindrical Magnetrons

Figure 14:
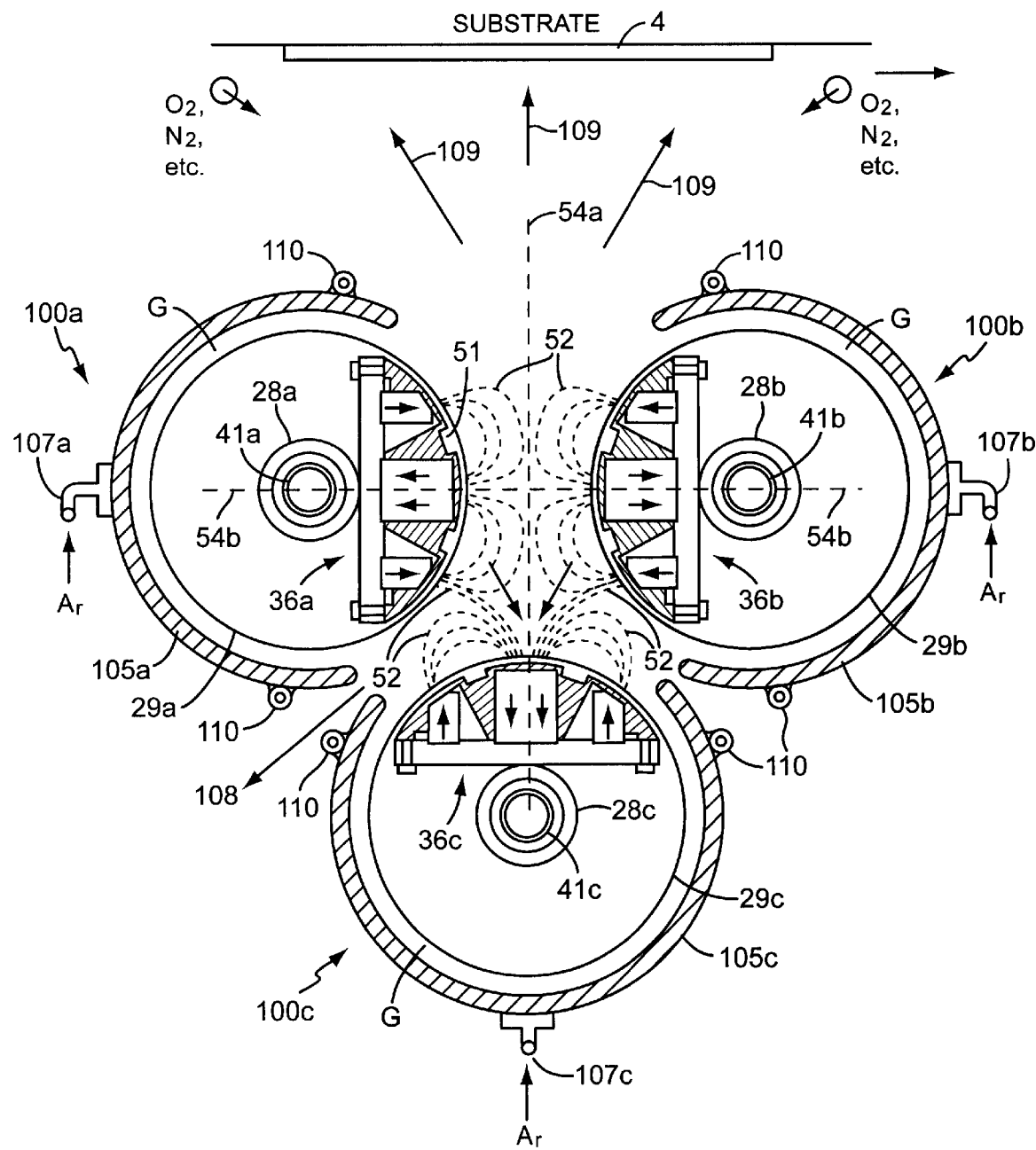
FIG. 14 shows a planar cross-sectional view of an apparatus with triple magnetrons that have one type of magnetic assemblies.

The triple rotatable cylindrical magnetrons configuration as contemplated by this invention, also called TriMag, is used in a deposition apparatus for deposition of thin films. This configuration is advantageous for both metallic and insulating or dielectric films that are formed by the process of sputtering a source material in the presence of a reactive gas. The metallic and dielectric films are very important in many high technology products including for example semiconductors, recording heads and discs, flat panel displays, solar cells and components used in fiber optics telecommunication equipment. The deposition apparatus with the triple rotatable cylindrical magnetrons configuration allows these films to be made faster, at high energy and more economically than was previously possible. FIG. 14 shows a top planar cross-sectional view of an apparatus with triple magnetrons sputtering source for high rate deposition of the thin films, where the magnetrons have one type of magnetic assembly. Elements in FIG. 14 that are common or equivalent to those shown in preceding figures are similarly designated.

In the TriMag configuration, two of the cylindrical magnetrons 100a and 100b are substantially equally distant from the substrate 4 and are opposed symmetrically while the third cylindrical magnetron 100c is equidistant from each of the two cylindrical magnetrons 100a and 100b opposite and further away from the substrate 4. The two symmetrically opposed cylindrical magnetrons 100a and 100b face each other forming a "hall of mirrors" to sputter and resputter target material. The third cylindrical magnetron 100c captures and resputters the target material (indicated by heavy arrows toward the third cylindrical magnetron 100c). Most of the sputtered material, including target material sputtered from the two cylindrical magnetrons and deposited on the third, eventually reaches the substrate 4 through deposition and resputtering from all three magnetrons 100a–c. This unique TriMag configuration provides superior characteristics including a net collection efficiency reaching 80% or more (as compared to conventional magnetron configurations that produce 25% or less).

It is noted that, although triple planar magnetrons (not shown) can be similarly positioned in place of the cylindrical magnetrons 100a–c, the triple cylindrical magnetrons produce higher collection efficiencies and are preferred over the triple planar magnetrons. It is further noted that various embodiments of the deposition apparatus include at least one set of improved dual or triple (or more than triple) rotatable cylindrical magnetrons mounted vertically in a vacuum chamber.

Structurally, each of the rotatable cylindrical magnetrons 100a, 100b and 100c (collectively 100a–c), includes cylindrical tubes (e.g., 28a–c, 29a–c, 41a–c and 105a–c, respectively) that extend in length perpendicular to the view. Each of the rotatable cylindrical magnetrons 100a–c includes a magnetic assembly 36a, 36b and 36c, respectively. The orientation of the magnets are indicated by the heavy arrows. As shown in FIG. 14, each of the cylindrical magnetrons 100a–c is fitted with a corresponding magnetic assembly 36a–c of a configuration type herein referred to as type-I configuration. In this configuration, the respective magnetic assemblies 36a–c of the rotatable cylindrical magnetrons 100a–c are substantially similar. The magnetron diameters and the strengths of the magnetic fields need not be the same (for example, magnetrons 100a and 100b can have larger diameters than magnetron 100c), but the relative directions of the magnetic fields 52 are the same for each. As is indicated by 52, the approximate field pattern in a type-I configuration occurs similarly at six locations. Dashed lines 54a and 54b intersect at right angles and mark boundaries that none of the magnetic fields lines 52 may cross if the field strengths and magnetic orientations of each magnetron are identical. The magnetic assemblies 36a and 36b in magnetrons 100a and 100b are shown as directly opposing each other (oriented 90° relative to line 54b). However, the magnetic assemblies 36a and 36b can be oriented at various angles with respect to line 54b. Each cylindrical target 29a–c in cylindrical magnetrons 100a–c is partially encapsulated by a cylindrical structure 105a–c. The sputtering gas, usually argon (Ar), is introduced through the corresponding one of cylindrical structures 105a and flows around each cylindrical target 29a–c in the space G between the cylindrical structure 105a–c and the surface of the target 29a–c forming a sputtering gas "curtain". The cylindrical structures 105a–c are not intended to be a "shield" in the usual meaning of the word when applied to sputtering technology (i.e., it is not intended as means to collect stray flux; See, by comparison, dark space shield 50a in FIG. 3a). Neither is their function necessarily electrical in nature (i.e., they are not an anode, and they may or may not be grounded). In the present case, the use of the respective cylindrical structures 105a–c is primarily to allow the introduction of the sputtering gas in close proximity to the plasma region that is created in front of the magnetic assemblies 36a–c. This is most important for reactive sputtering because the sputtering gas "curtain" provides a protective zone around those regions of the respective cylindrical target 29ac that are not being sputtered during its rotation. This function is thus appropriately referred to as a "protective cocoon" and each of the cylindrical structures 105a–c may be appropriately referred to as the "cocoon". Pumping of the sputtering gas can be accomplished in any suitable way including via respective gas inlets or manifolds 107a–c. Arrow 108 indicates that the separation between the edges of each cocoon, may be varied to regulate the position and intensity of pumping in the vicinity of the cylindrical magnetrons 100a–c. During operation, cylindrical magnetrons 100a and 100b transfer significant amounts of sputtered material between them (in the hall of mirrors). The flux that is at high angles with respect to the local sputtering surfaces escapes either toward the substrate 4 or toward cylindrical magnetron 100c where it is collected and resputtered with a high percentage of the flux directed toward the substrate 4. Arrows 109 indicate that a beam of sputtered flux is directed toward the substrate 4. The triple cylindrical magnetrons geometry can be configured such that substantially all of the sputtered flux eventually (after some resputtering) reaches the substrate 4. In optimal configurations target material collection efficiency may easily exceed 80%. It is noted that with such a large inventory of target material (three magnetrons) and high collection efficiency, deposition times can become long. Slow build up of small amounts of flux on the edges of the cocoons 105a–c and possible thermal expansion of these cocoons could become run time limiting factors. To minimize these effects the cocoons 105a–c are shown with water cooling tubes 110 attached near each edge.

Figure 15:
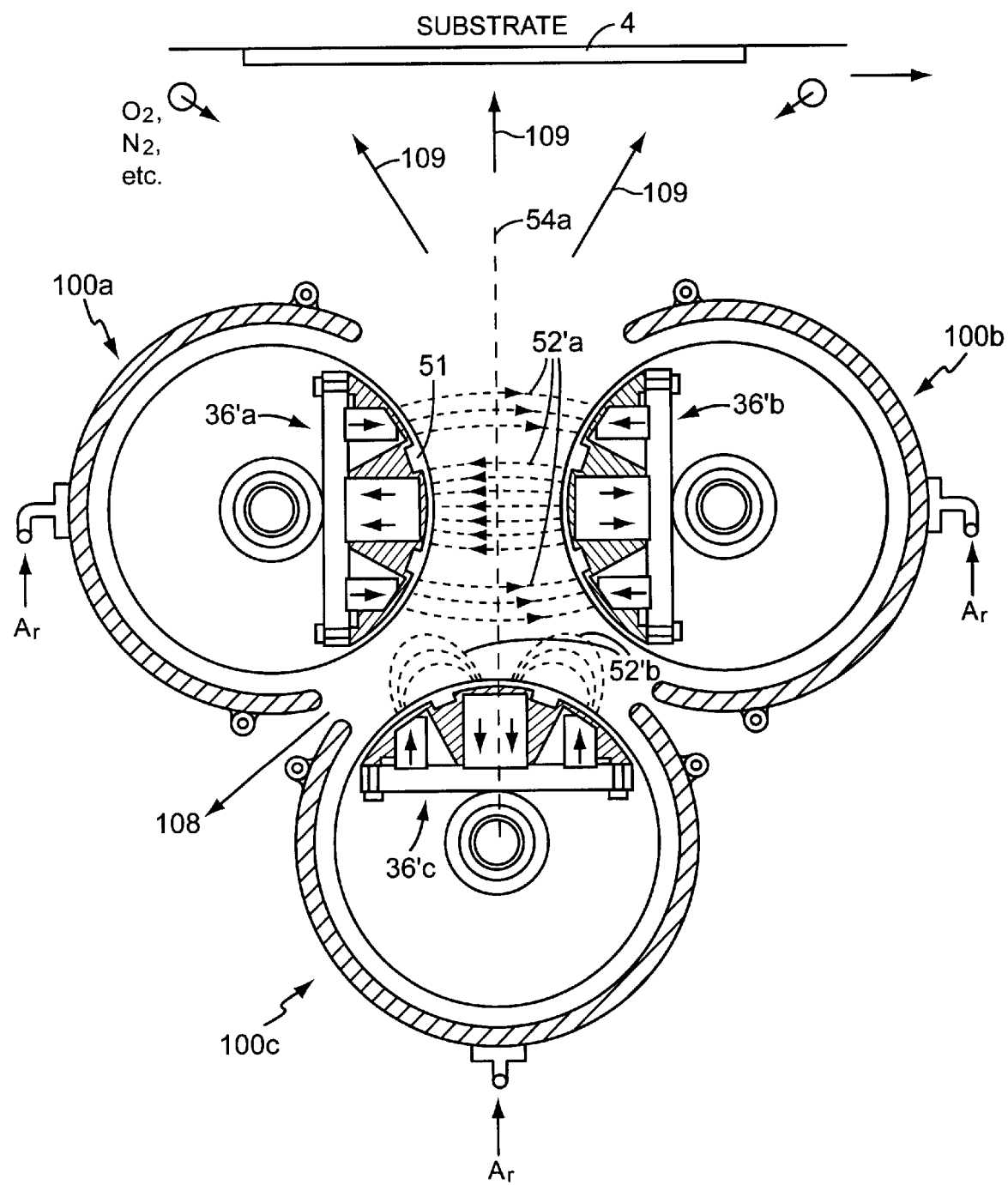
FIG. 15 shows a planar cross-sectional view of an apparatus with triple magnetrons that have a second type of magnetic assemblies.

As shown in FIG. 15, each of the cylindrical magnetrons 100a–c may be alternatively fitted with a corresponding magnetic assembly 36a–c of a second configuration type herein referred to as type-II configuration. FIG. 15 shows a top planar cross-sectional view of the apparatus with triple magnetrons that are fitted with the type-II magnetic assembly configuration 36'a–c. The type-II configuration forms a bi-directional magnetic field resulting from inverting the magnetic poles in either magnetron 100*a* or magnetron 100*b*. The magnetic field 52'*a–b* formation shown schematically in FIG. 15 results from the magnetic poles in magnetron 100*b* being inverted with respect to those shown in FIG. 14 (See, arrows in magnetic assembly 36'*b* as compared to arrows in magnetic assembly 36*b*). In this geometry, the magnetic field lines 52'*a* that cross between magnetrons 100*a* and 100*b* do so essentially perpendicular to dashed line 54*a*. The inner part of the field lines 52'*a* is directed opposite to the outer part of the file as indicated by the arrow heads on the field lines.

Figure 16:
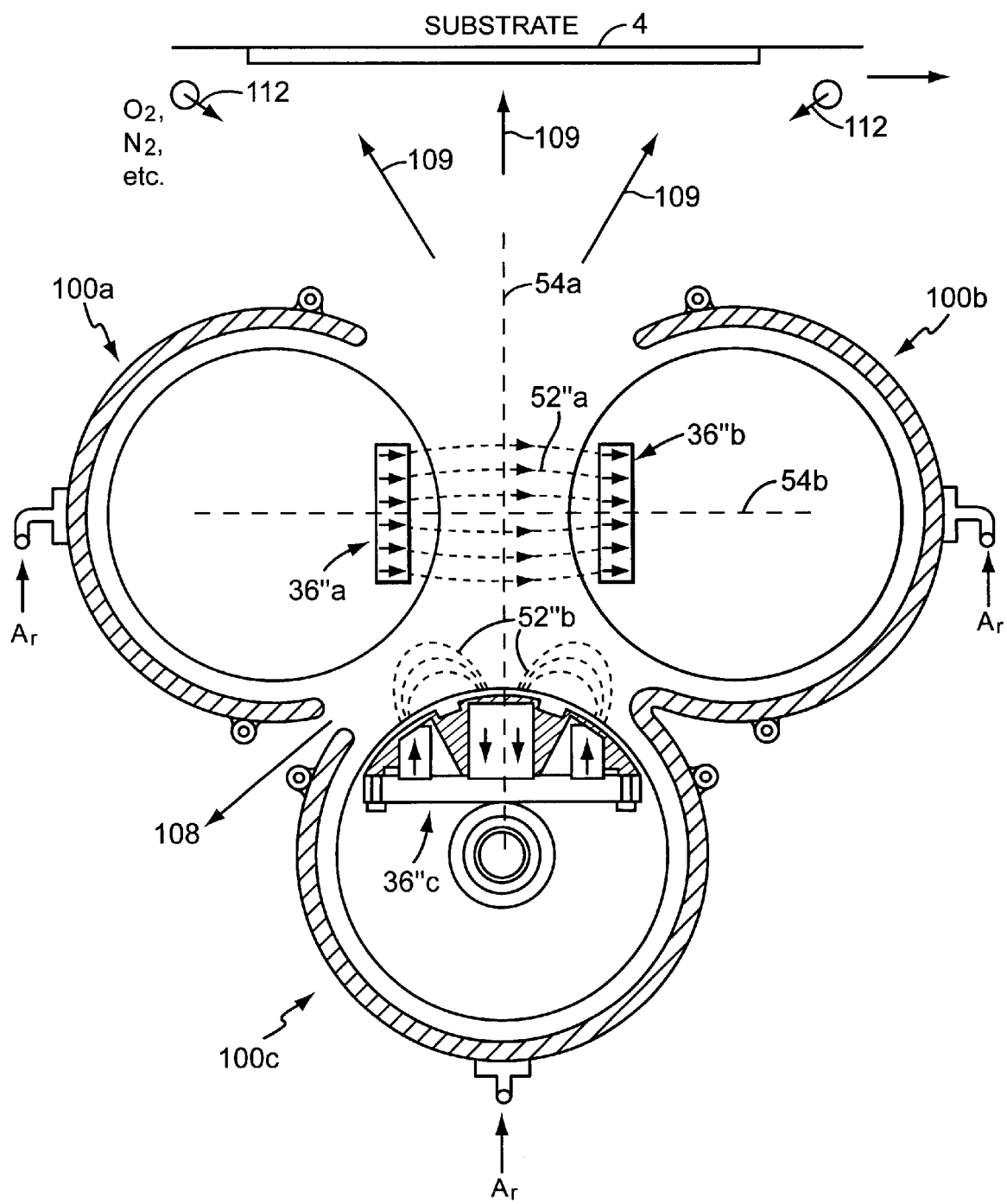
FIG. 16 shows a planar cross-sectional view of an apparatus with triple magnetrons that have a third type of magnetic assemblies.

As yet another alternative, a more general form of the type-II configuration is shown in FIG. 16. As shown, the magnetic assemblies 36'*a* and 36'*b* in cylindrical magnetrons 100*a* and 100*b* (FIG. 14) are replaced by magnetic plates 36"*a* and 36"*b* the magnetic pole orientations of which are indicated by the arrows. The magnetic field lines 52"*a* between the plates 36"*a–b* are essentially parallel to each other and perpendicular to dashed line 54*a*. The magnetic field lines 52"*b* form a field pattern similar to the field patterns 52 and 52'*b* in FIGS. 14 and 15 respectively. Analogously to the type-I magnetic assemblies, plates 36"*a* and 36"*b* may also be rotated or tilted with respect to line 54*b* to produce different interactions between them or to direct the sputtered flux in different directions. Advantageously, in magnetrons with type-II magnetic assemblies as compared with magnetrons with type-I magnetic assemblies, the magnetic field lines 52'*a* between the two magnetrons 100*a* and 100*b* are directed across the path of electrons emitted from the third magnetron 100*c* along line 54*a* toward the substrate 4. This behavior effectively stops any heating of the substrate 4 from the highly energetic electrons emitted from the sputtering plasma. This advantage is an important consideration for maintaining higher deposition rates on heat sensitive substrates. The illustrated type-II magnetic assembly 36"*a–b* configuration is especially useful for reactive sputtering onto heat sensitive substrates 4, since the ion and electron bombardment environment at the substrate 4 is generally more severe than that produced in argon (Ar) sputtering of a metallic film.

The magnetic assembly configurations, whether type-I or type-II, may be powered by various combinations of DC, AC, and/or RF power supplies. For the sputtering of electrically conductive target materials, it is convenient to use three individual DC power supplies. In this way the sputtering rate from each magnetron may be separately adjusted to meet the requirements of different process objectives. For example the third magnetron 100*c* could be provided with a different target material from the others, and with independent control of its sputtering rate, different compositions of an alloy material could be easily produced. Reactive sputtering could be conveniently accomplished by driving the magnetic assemblies in magnetrons 100*a* and 100*b* with an AC source, while the magnetic assembly in magnetron 110*c* is powered with a DC source. The reactive gas 112 (FIG. 4) is preferably introduced near the substrate 4. For the sputtering of non-conducting (dielectric) materials, some or all of the magnetrons would be driven with RF power.

CONCLUSION

Although the present invention has been described in considerable detail with reference to certain preferred versions thereof, other versions are possible. Therefore, the spirit and scope of the appended claims should not be limited to the description of the preferred versions contained herein.

What is claimed is:

1. A method for high rate deposition of thin films, comprising:

presenting a substrate to a deposition apparatus;

fitting dual cylindrical magnetrons in a vacuum chamber of the deposition apparatus, each of the dual cylindrical magnetrons including
a target made out of a target material and having a cylindrical shape, the target being rotable,
a magnet assembly supporting a sputtering plasma in a sputtering region that causes particles of the target material to be deposited on the substrate;

fitting a shield around the target within each of the dual cylindrical magnetrons so that a narrow gap is formed between the shield and the target, the shield having a cutout facing the substrate;

introducing a sputtering gas into the vacuum chamber and allowing the sputtering gas to flow into the narrow gap, the sputtering gas flowing in the narrow gap around the target in each of the cylindrical magnetrons at higher pressure than in the vacuum chamber and entering the sputtering region at the edges of the shield cutout, wherein a sputtering gas curtain exists in the narrow gap around regions of the target which are not being sputtering during rotation of the target; and introducing a reactive gas into the vacuum chamber, wherein a sweeping action of the sputtering gas flow in the narrow gap together with the higher pressure of the sputtering gas in the narrow gap maintains the target within each of the cylindrical magnetrons in a state substantially free of the reactive gas during sputtering operations.

2. The method of claim 1 wherein the shield is constructed from a conductive material so that it can serve as an anode.

3. The method of claim 1 wherein the deposition apparatus performs high rate reactive deposition of dielectric thin films.

4. The method of claim 1 wherein the target material is either conductive or insulating material.

5. The method of claim 1 wherein the sputtering gas is argon and the reactive gas is oxygen.

6. The method of claim 1 wherein sputtered material from the target is deposited on the substrate at a particular substrate position, the method further comprising fitting the deposition apparatus with a deposition shield that prevents high angle, low energy sputtered material from reaching the particular substrate position.

7. The method of claim 1 wherein the pressure of the sputtering gas in the vacuum chamber is one millitorr or less and the pressure in the narrow gap is more than one millitorr.

8. The method of claim 1 wherein, for added control sensitivity, the deposition apparatus is fitted with a fast acting valve having a switching time of a few milliseconds or less for the introduction of the sputtering gas.

9. The method of claim 8 wherein the fast acting valve is a Piezoelectric valve with a fast response time.

10. The method of claim 1 wherein the sputtering gas is introduced into the vacuum chamber at a side of the vacuum chamber in order to allow mounting of a turbomolecular pump on the back of the chamber.

11. The method of claim 1 further comprising fitting the deposition apparatus with a local pump and one or more pumps located in the vacuum chamber; and
allowing the sputtering gas to flow into the local pump rather than through the one or more pumps in the vacuum chamber so that it is possible to increase the flow of sputtering gas and at the same time maintain a low total pressure of the sputtering gas and a fast response time, wherein deposition process control is improved.

12. An apparatus for high rate deposition of thin films, comprising:
  at least one set of dual cylindrical magnetrons in a vacuum chamber of the deposition apparatus, each of the cylindrical magnetrons including
    a target made of a target material and having a cylindrical shape, the target being rotatable,
    a magnet assembly for supporting a sputtering plasma in a sputtering region that causes particles of the target material to be deposited on a substrate, and
    a shield partially encapsulating the target so that a narrow gap is formed between the shield and the target, the shield having a cutout bordering the sputtering region;
  means for introducing a sputtering gas into the vacuum chamber at a first pressure via the narrow gap in each of the cylindrical magnetrons, the sputtering gas flowing in the narrow gap around the target in each of the cylindrical magnetrons being at higher pressure than in the vacuum chamber and entering the sputtering region at the edges of the shield cutout, thereby forming a sputtering gas curtain around regions of the target which are not being sputtered during rotation of the target; and
  means for introducing a reactive gas into the vacuum chamber at a second pressure lower than said first pressure such that the sputtering gas flow in the narrow gap within each of the dual magnetrons, together with the higher pressure of the sputtering gas in the narrow gap causes a sweeping action that maintains the target within the regions of the gap in a state substantially free of the reactive gas during sputtering operations.

13. The apparatus of claim 12 wherein the shield is constructed from a conductive material so that it can serve as an anode.

14. The apparatus of claim 12 configured to perform high rate reactive deposition of dielectric thin films.

15. The apparatus of claim 12 wherein the target material is either conductive or insulating material.

16. The apparatus of claim 12 wherein the sputtering gas is argon and the reactive gas is oxygen.

17. The apparatus of claim 12 further comprising a deposition shield positioned to prevent high angle, low energy sputtered material from reaching the substrate, particularly, at a location where sputtered material from the target is being deposited, wherein the apparatus produces a restricted band of sputtered target material and, at the same time, achieves improved target material collection efficiency.

18. The apparatus of claim 12 wherein the pressure of the sputtering gas in the vacuum chamber is one millitorr or less and the pressure in the narrow gap is more than one millitorr.

19. The apparatus of claim 12 wherein, for added control sensitivity, the sputtering gas introduction means includes a fast acting valve having a switching time of a few milliseconds or less.

20. The apparatus of claim 19 wherein the fast acting valve is a Piezoelectric valve with a fast response time.

21. The apparatus of claim 12 wherein the sputtering gas introduction means is mounted on a side of the vacuum in order to allow mounting of a turbomolecular pump on the back of the chamber.

22. The apparatus of claim 12 further comprising a local pump and one or more pumps mounted in the vacuum chamber in a configuration that allows the sputtering gas to flow into the local pump rather than through the one or more pumps so that it is possible to increase the flow of sputtering gas and at the same time maintain a low total pressure of the sputtering gas and a fast response time, wherein deposition process control is improved.

23. The apparatus of claim 12 in which the shield in one of the dual cylindrical magnetrons is electrically isolated from the shield in another of the dual cylindrical magnetron, and wherein the shield in either or both of the dual cylindrical magnetrons may be driven in phase with an AC power source.

24. An apparatus for high rate deposition of thin films, comprising:
  at least one set of three magnetrons arranged to form a triple magnetron configuration in which two of three magnetrons are mounted symmetrically opposite each other and equidistant from a substrate position while a third of the three magnetrons is mounted further away from the substrate position and equidistant from the two magnetrons, the two, symmetrically opposed magnetrons being mounted facing each other to form a hall of mirrors for sputtering and resputtering target material, the third magnetron being configured to capture and resputter the target material so that a substantial part of the sputtered target material reaches the substrate position, each of the three magnetrons including a target constructed of the target material, a magnet assembly coupled to the target and supporting a sputtering plasma in a sputtering region in front of the magnet assembly, the magnet assembly being capable of orientation at various angles, wherein the deposition apparatus provides a superior net collection efficiency.

25. The apparatus of claim 24 wherein the target in each of the three magnetrons is rotatable, and wherein each the three magnetrons further includes a structure partially encapsulating the target so as to allow introduction of a sputtering gas in close proximity to the plasma region and formation of a protective zone around those regions of the target that are not being sputtered during rotation of the target.

26. The apparatus of claim 25 wherein each of the three magnetrons further includes water cooling means coupled to the target encapsulating structure.

27. The apparatus of claim 24 being configured for deposition of metallic and/or dielectric thin films formed in the presence of a reactive gas.

28. The apparatus of claim 24 in which the magnet assembly in the three magnetrons is structurally substantially similar.

29. The apparatus of claim 24 in which the triple magnetron configuration can assume a geometry such that substantially most of the sputtered material eventually reaches the substrate position.

30. The apparatus of claim 24 wherein the magnetrons are either cylindrical or planar so that the target is either cylindrical or planar, respectively.

31. The apparatus of claim 24 in which the magnet assemblies of the two, symmetrically opposed magnetrons are mounted directly opposing each other and together with the magnet assembly of the third magnetron forming six magnetic field patterns.

32. The apparatus of claim 24 in which the magnet assemblies of the two, symmetrically opposed magnetrons are mounted directly opposing each other and forming magnetic fields in two directions, one of the magnetic fields being central and oriented in one direction and others of the magnetic fields, one on each side of the central field, being oriented in the opposite direction.

33. The apparatus of claim 24 in which the magnet assemblies of the two, symmetrically opposed magnetrons are magnetic plates mounted directly opposing each other and forming a uni-directional magnetic field.

34. The apparatus of claim 24 in which the target material of the target in the third magnetron is different from the target material of the targets in the two, symmetrically opposed magnetrons.

35. The apparatus of claim 24 in which a sputtering rate of the third magnetron can be controlled independently from the sputtering rate of the two, symmetrically opposed magnetrons.

36. The apparatus of claim 24 in which the three magnetrons can be separately or jointly powered by each or a combination of DC, AC or RF power sources.

37. The apparatus of claim 24 in which the at least one set includes more than three magnetrons.

38. The magnetron of claim 24 in which not all the magnetrons have identical dimensions.

* * * * *